(12) United States Patent
Chiang

(10) Patent No.: US 6,486,549 B1
(45) Date of Patent: Nov. 26, 2002

(54) SEMICONDUCTOR MODULE WITH ENCAPSULANT BASE

(75) Inventor: Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/052,810

(22) Filed: Nov. 10, 2001

(51) Int. Cl.$^7$ ............................................... H01L 23/34
(52) U.S. Cl. ..................... 257/723; 257/687; 257/693; 257/698; 257/778; 257/797
(58) Field of Search ................. 257/723, 687, 257/693, 698, 778, 797

(56) References Cited

U.S. PATENT DOCUMENTS

| | | | |
|---|---|---|---|
| 4,706,166 A | 11/1987 | Go ........................ | 361/403 |
| 4,807,021 A | 2/1989 | Okumura ................. | 357/75 |
| 4,859,722 A | 8/1989 | Shiobara et al. ......... | 523/433 |
| 4,897,708 A | 1/1990 | Clements ................ | 357/65 |
| 4,954,875 A | 9/1990 | Clements ................ | 357/75 |
| 4,984,358 A | 1/1991 | Nelson .................. | 29/830 |
| 4,985,600 A | 1/1991 | Heerman ................ | 174/255 |
| 4,996,583 A | 2/1991 | Hatada .................. | 357/70 |
| 5,049,979 A | 9/1991 | Hashemi et al. ......... | 357/75 |
| 5,081,520 A | 1/1992 | Yoshii et al. ........... | 357/80 |
| 5,104,820 A | 4/1992 | Go et al. ............... | 437/51 |
| 5,132,778 A | 7/1992 | Juskey et al. ........... | 357/72 |
| 5,138,438 A | 8/1992 | Masayuki et al. ........ | 357/75 |
| 5,332,922 A | 7/1994 | Oguchi et al. .......... | 257/723 |
| 5,394,303 A | 2/1995 | Yamaji ................. | 361/749 |
| 5,477,087 A | 12/1995 | Kawakita et al. ........ | 257/737 |
| 5,484,959 A | 1/1996 | Burns ................... | 174/524 |
| 5,508,228 A | 4/1996 | Nolan et al. ........... | 437/183 |
| 5,514,907 A | 5/1996 | Moshayedi ............. | 257/723 |
| 5,625,221 A | 4/1997 | Kim et al. ............. | 257/686 |
| 5,744,827 A | 4/1998 | Jeong et al. ........... | 257/686 |
| 5,804,874 A | 9/1998 | An et al. .............. | 257/676 |
| 5,854,507 A | 12/1998 | Miremadi et al. ........ | 257/686 |
| 5,861,666 A | 1/1999 | Bellaar ................. | 257/686 |
| 5,910,685 A | 6/1999 | Watanabe et al. ........ | 257/777 |

(List continued on next page.)

FOREIGN PATENT DOCUMENTS

| | | | | |
|---|---|---|---|---|
| DE | A-37 32 249 A1 | 4/1989 | ........... | B23K/26/00 |
| EP | A-0 361 192 B1 | 2/1994 | ............ | H05K/3/02 |

OTHER PUBLICATIONS

U.S. patent application Ser. No. 09/917,358, filed Jul. 27, 2001, entitled "Three–Dimensional Stacked Semiconductor Package".

(List continued on next page.)

*Primary Examiner*—David Nelms
*Assistant Examiner*—Tu-Tu Ho
(74) *Attorney, Agent, or Firm*—David M. Sigmond

(57) ABSTRACT

A semiconductor module includes a first semiconductor chip assembly, a second semiconductor chip assembly, an encapsulant base and an electrical interconnect. The first assembly includes a first semiconductor chip, a first conductive trace and a first connection joint, the first chip includes a first conductive pad, the first trace extends within and outside a periphery of the first chip, and the first connection joint contacts and electrically connects the first trace and the first pad. The second assembly includes a second semiconductor chip, a second conductive trace and a second connection joint, the second chip includes a second conductive pad, the second trace extends within and outside a periphery of the second chip, and the second connection joint contacts and electrically connects the second trace and the second pad. The encapsulant base is disposed between and in contact with the first and second chips and the first and second traces. The electrical interconnect contacts the first and second traces in a through-hole that extends through the encapsulant base and is located outside the peripheries of the first and second chips, thereby electrically connecting the first and second traces.

70 Claims, 27 Drawing Sheets

U.S. PATENT DOCUMENTS

| | | | | |
|---|---|---|---|---|
| 5,929,516 A | | 7/1999 | Heerman et al. | 257/701 |
| 5,973,393 A | | 10/1999 | Chia et al. | 257/690 |
| 5,994,166 A | * | 11/1999 | Akram et al. | 257/686 |
| 6,020,629 A | * | 2/2000 | Farnworth et al. | 174/255 |
| 6,072,233 A | | 6/2000 | Corisis et al. | 257/686 |
| 6,122,172 A | | 9/2000 | Dumoulin et al. | 361/719 |
| 6,124,633 A | | 9/2000 | Vindasius et al. | 257/685 |
| 6,231,364 B1 | | 5/2001 | Liu | 439/326 |
| 6,233,154 B1 | | 5/2001 | Farnworth et al. | 361/752 |
| 6,413,798 B2 | * | 7/2002 | Asada | 438/106 |

OTHER PUBLICATIONS

U.S. patent application Ser. No. 09/878,649, filed Jun. 11, 2001, entitled "Method of Making a Semiconductor Chip Assembly with a Conductive Trace Subtractively Formed Before and After Chip Attachment".

U.S. patent application Ser. No. 09/878,626, filed Jun. 11, 2001, entitled "Method of Connecting a Conductive Trace to a Semiconductor Chip".

Sugaya et al., "A New 3-D Module Using Embedded Actives and Passives," Proceedings of the 2001 International Symposium on Microelectronics, Oct. 9, 2001, pp. 248–253.

Nishida et al., "High Density Packaging Using Flip Chip Technology In Mobile Communication Equipment," Proceedings of the 2001 International Symposium on Microelectronics, Oct. 9, 2001, pp. 272–277.

* cited by examiner

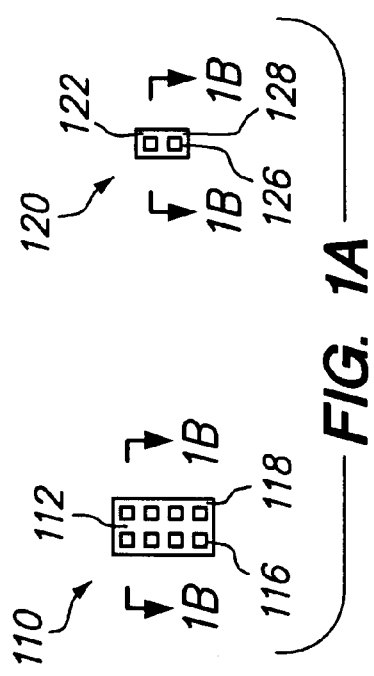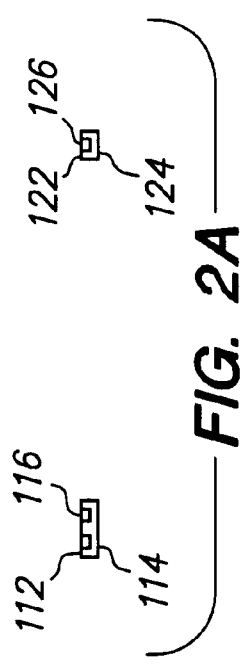

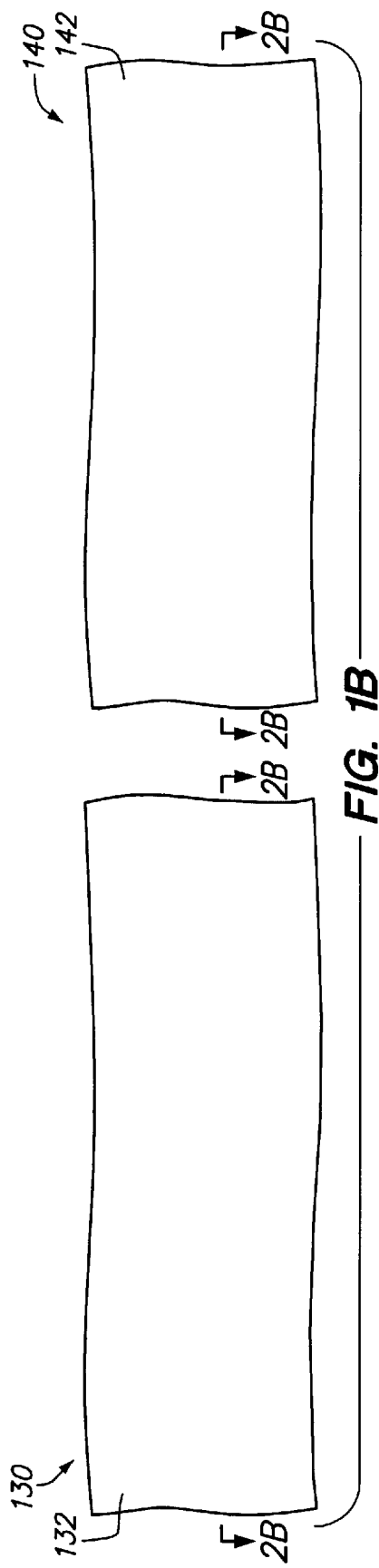
FIG. 1B
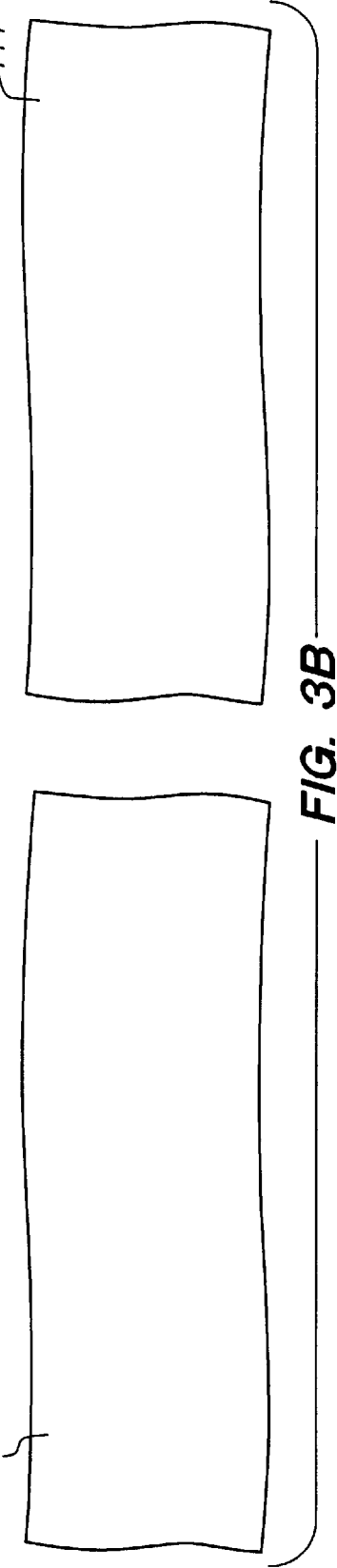
FIG. 2B
FIG. 3B

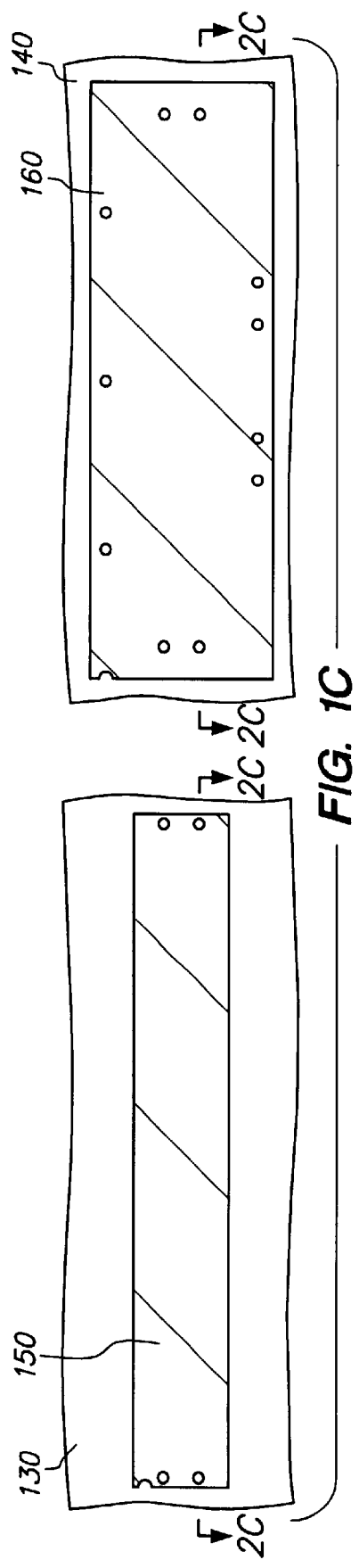
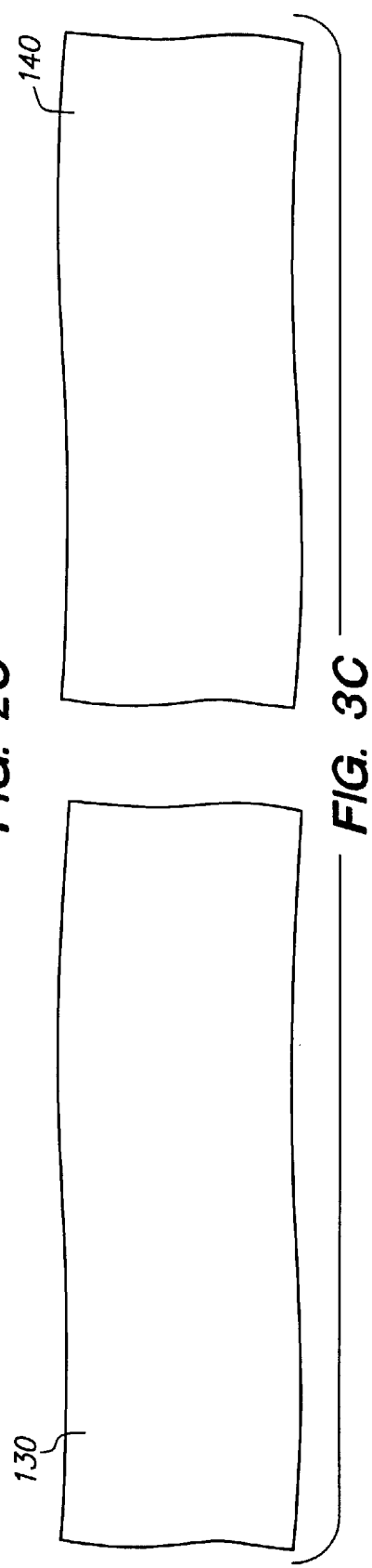
FIG. 1C
FIG. 2C
FIG. 3C

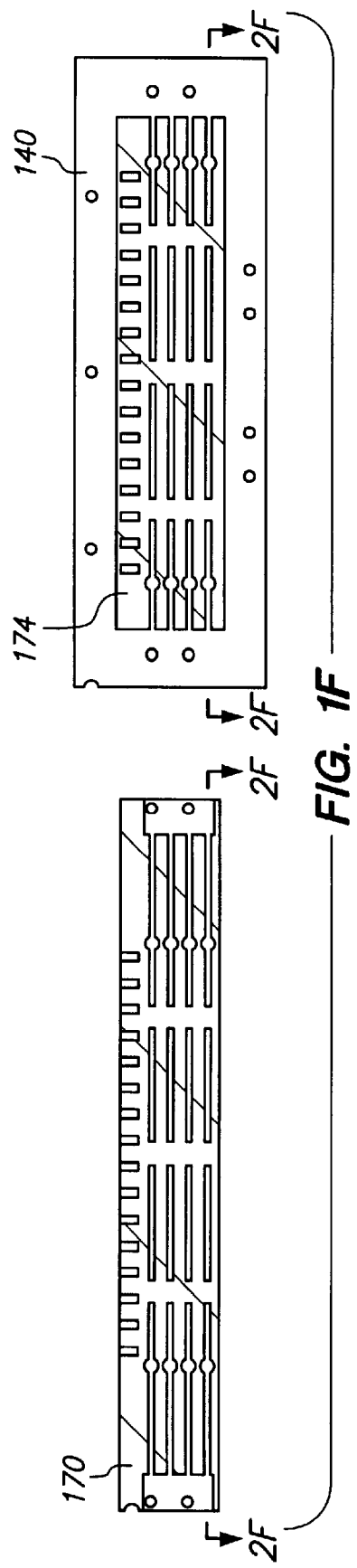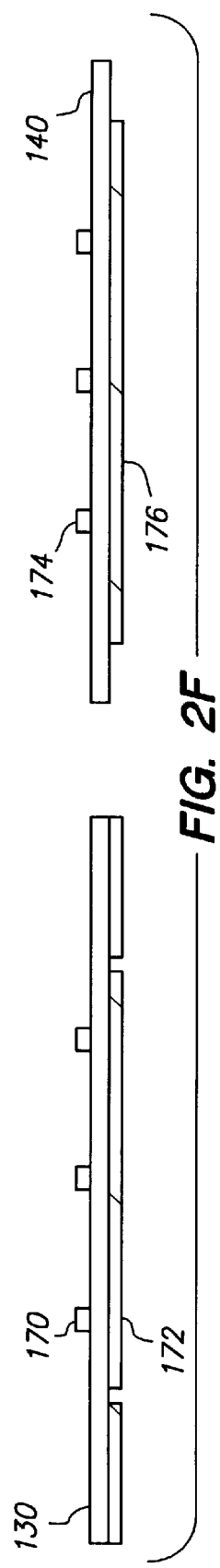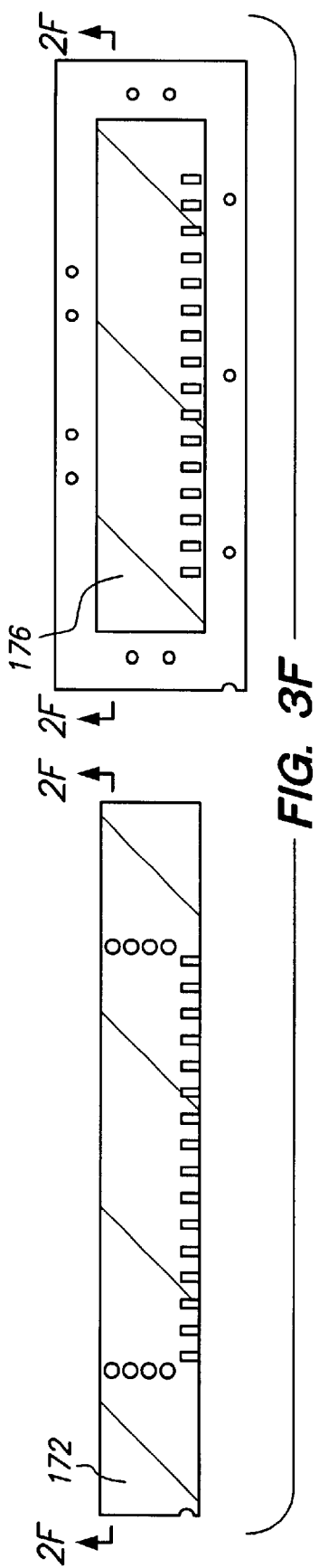

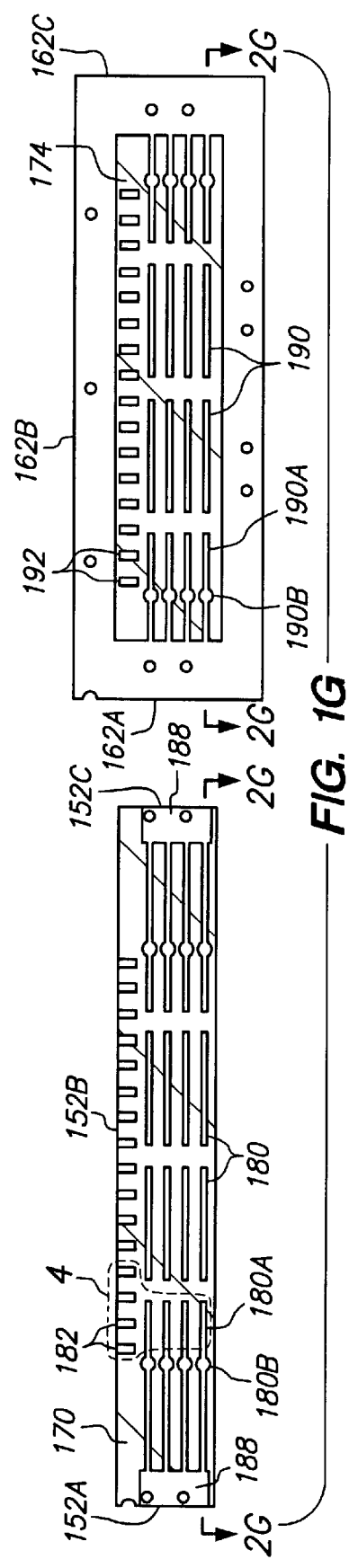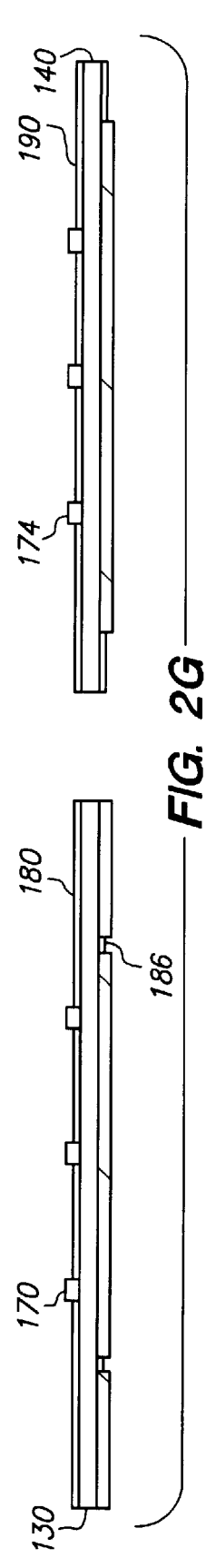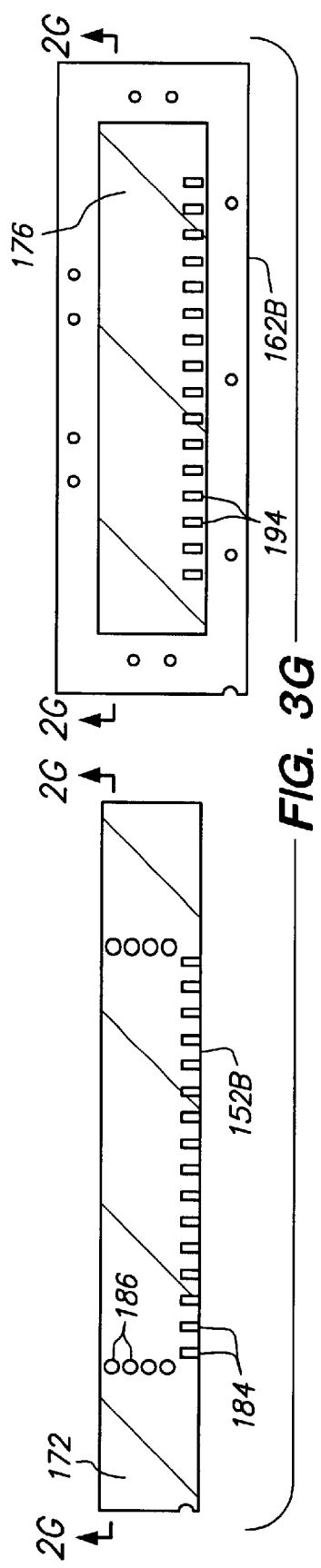

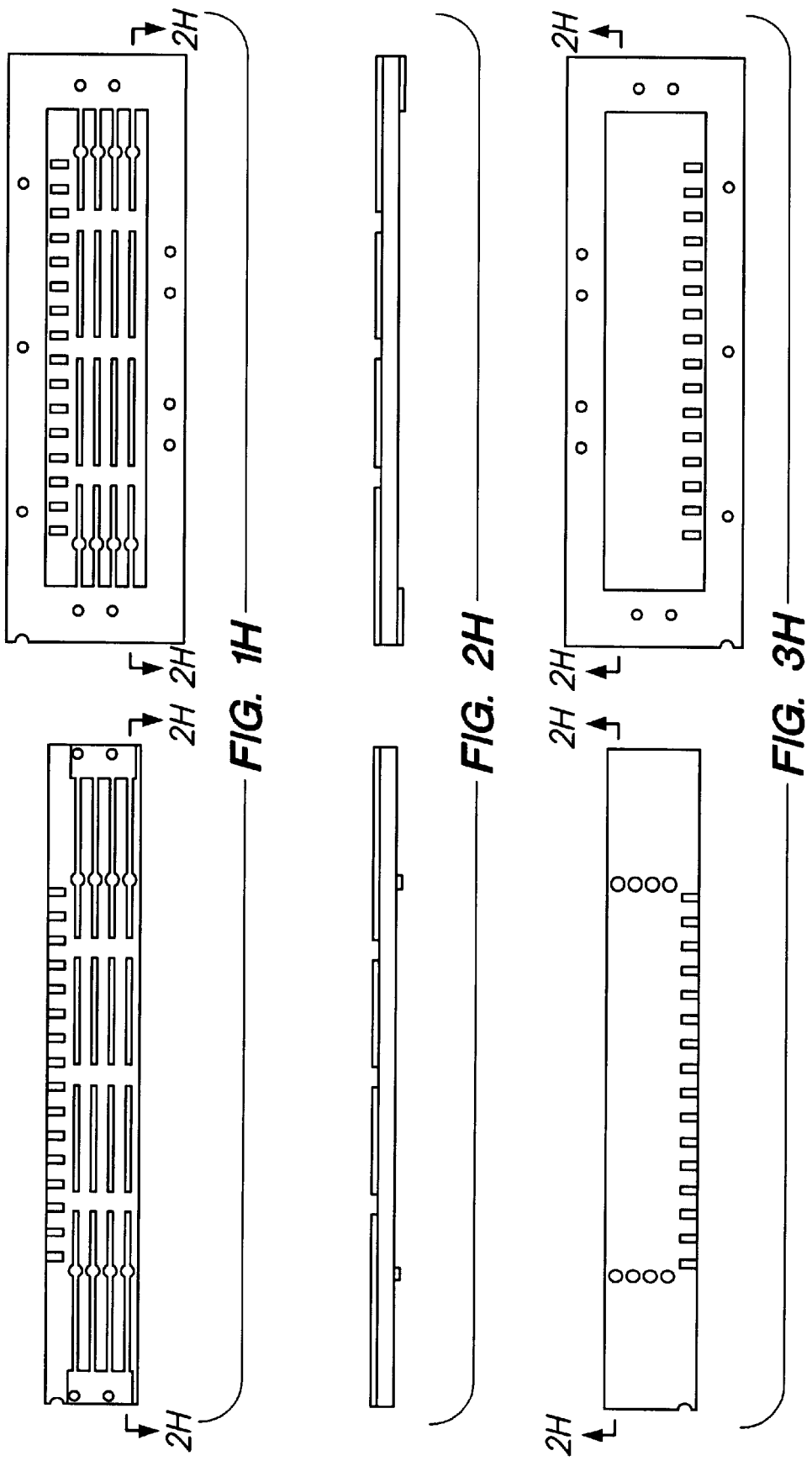

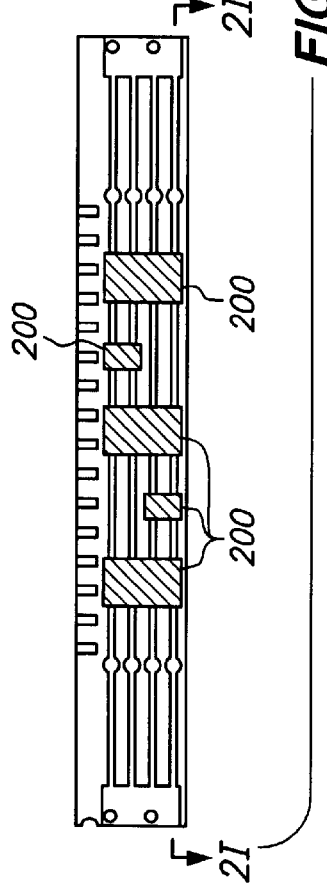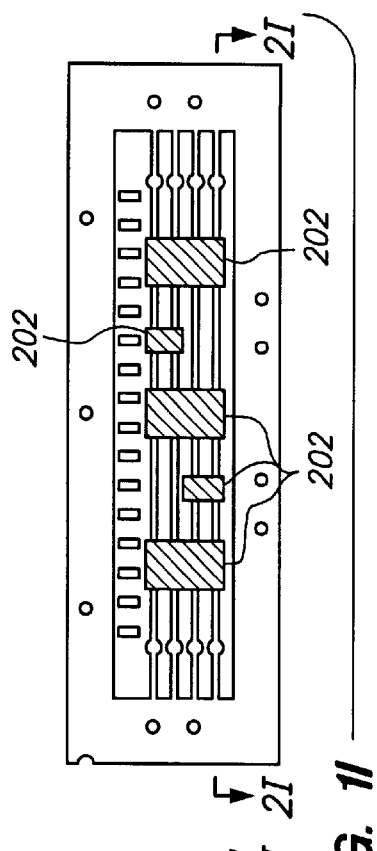
FIG. 1I
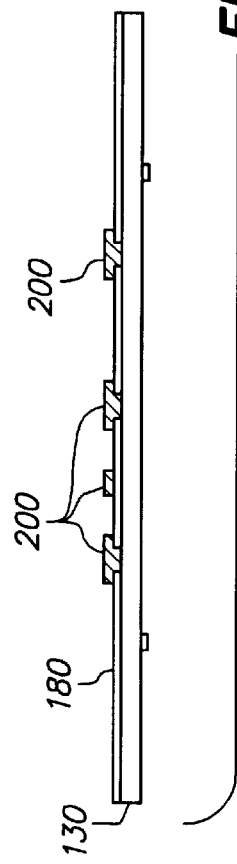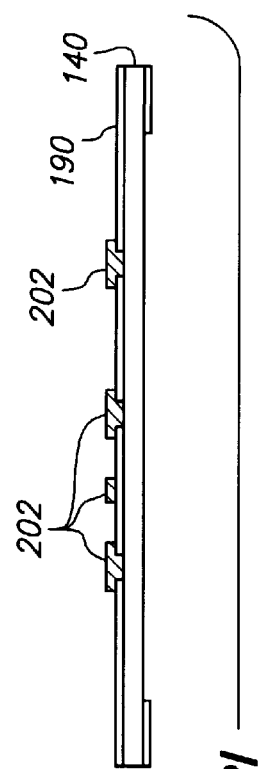
FIG. 2I
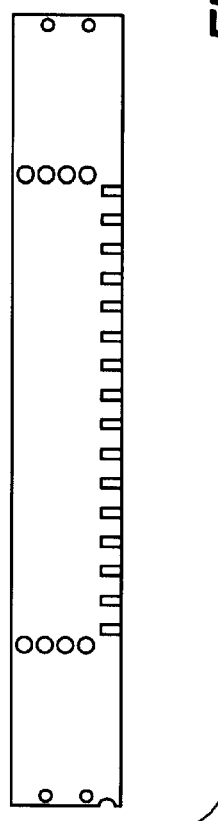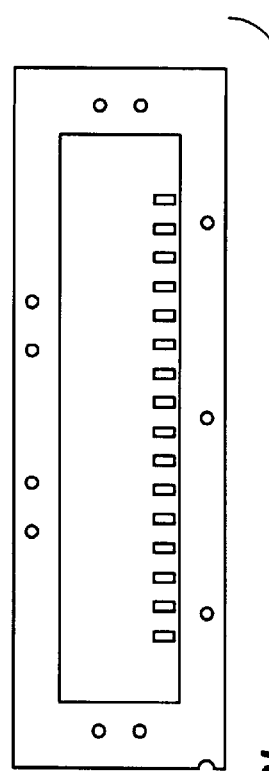
FIG. 3I

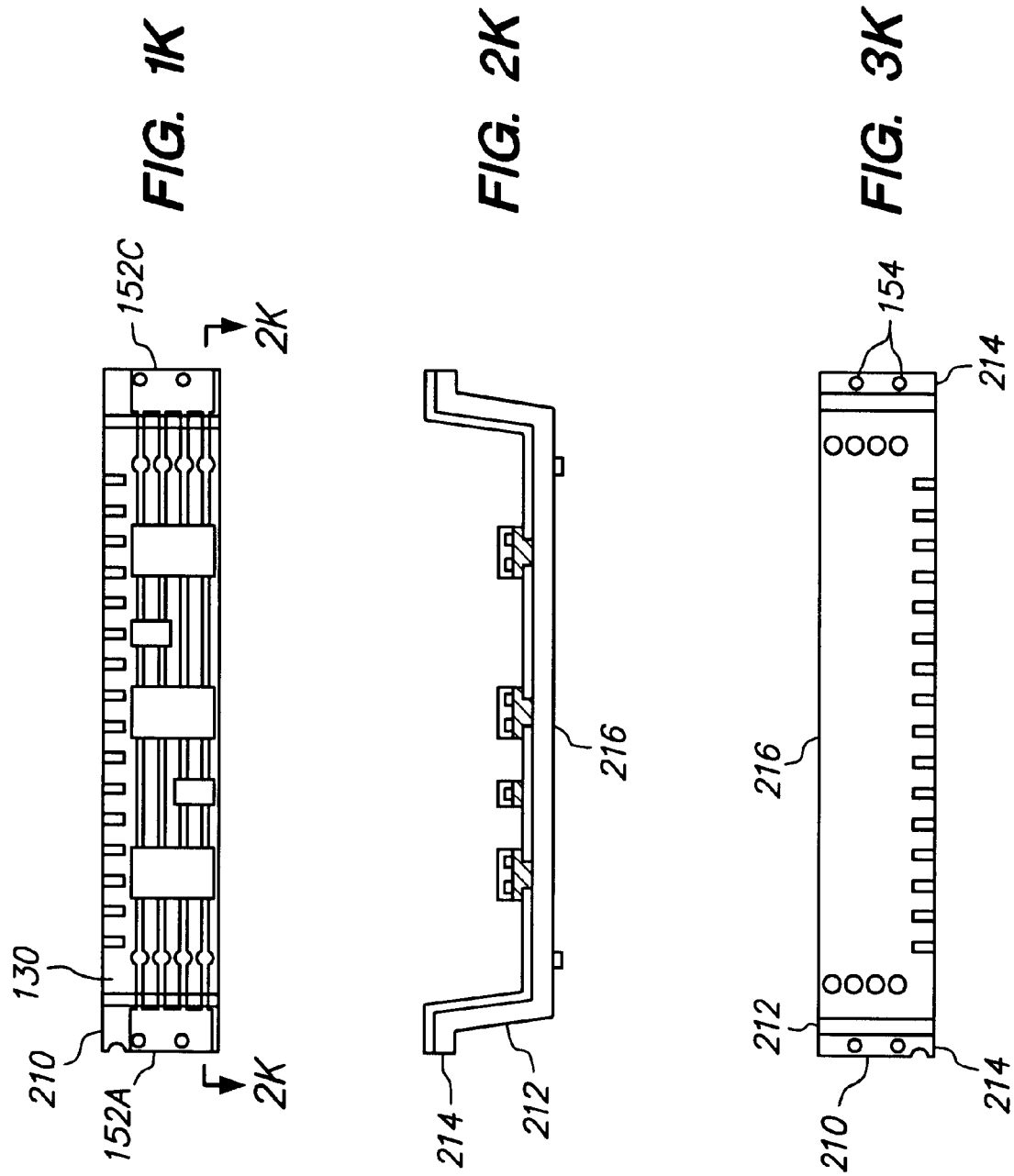

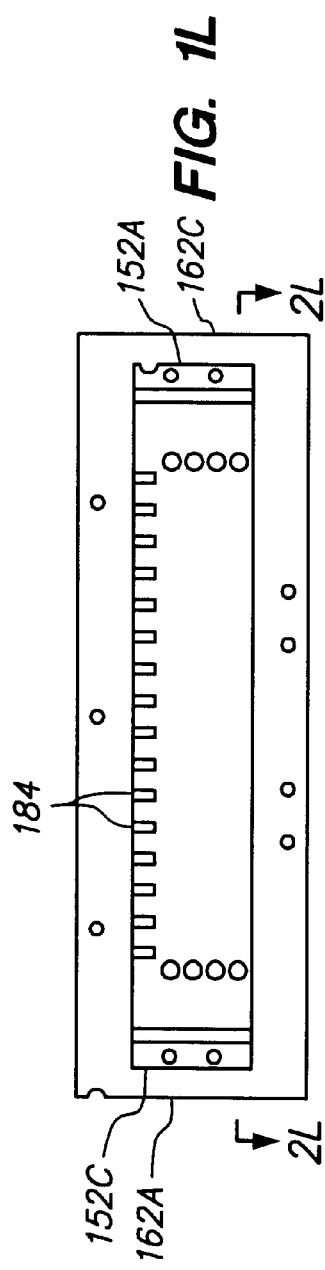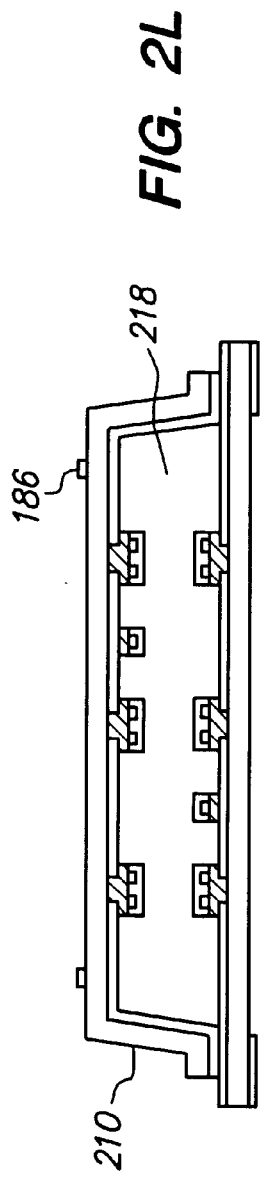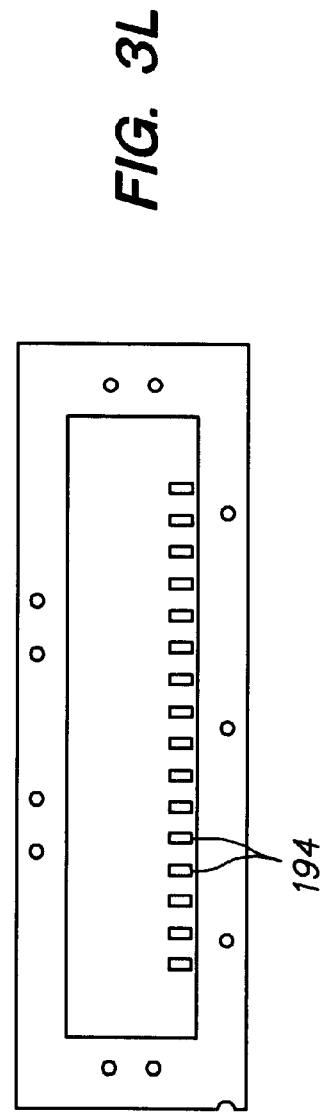

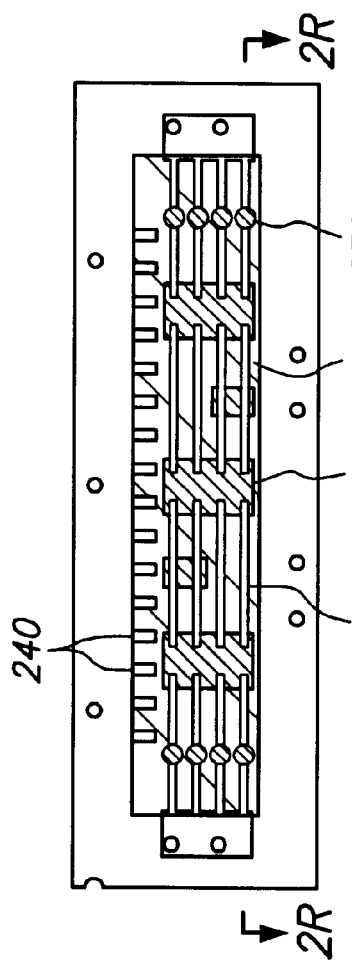
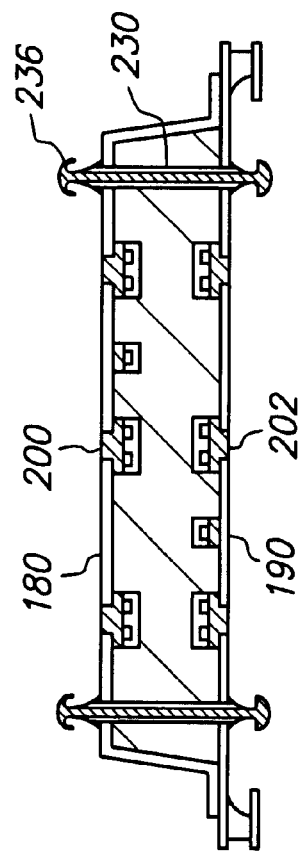
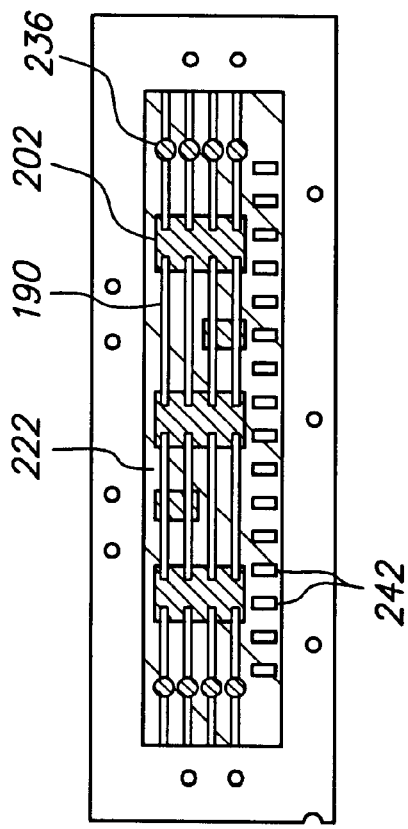
FIG. 1R
FIG. 2R
FIG. 3R

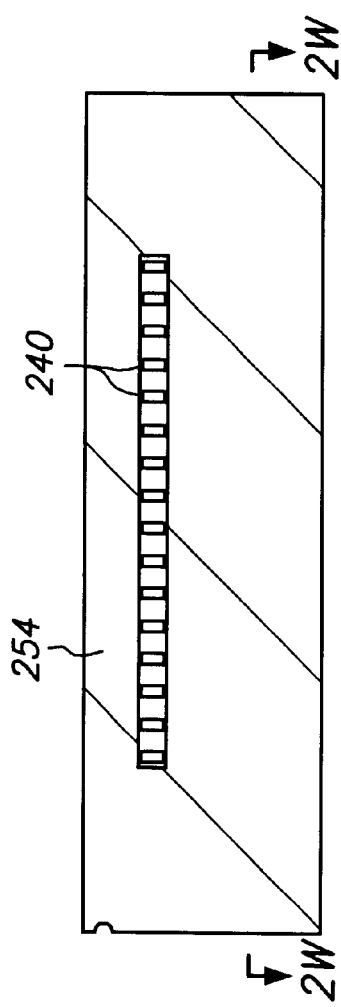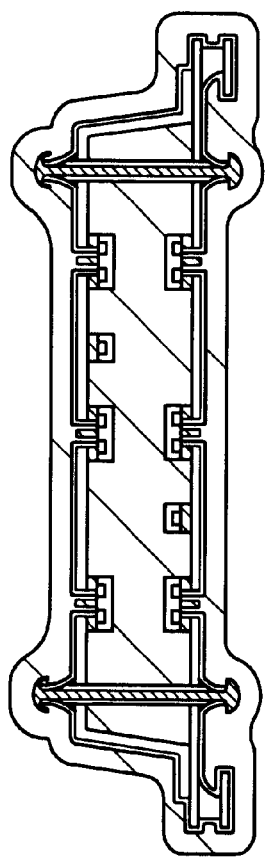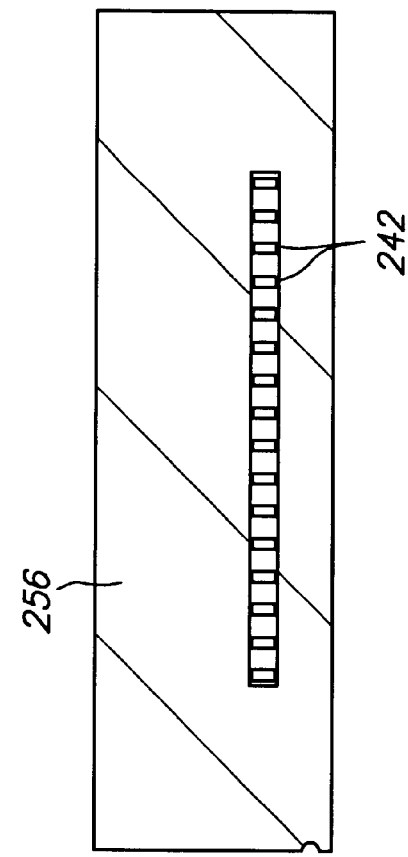

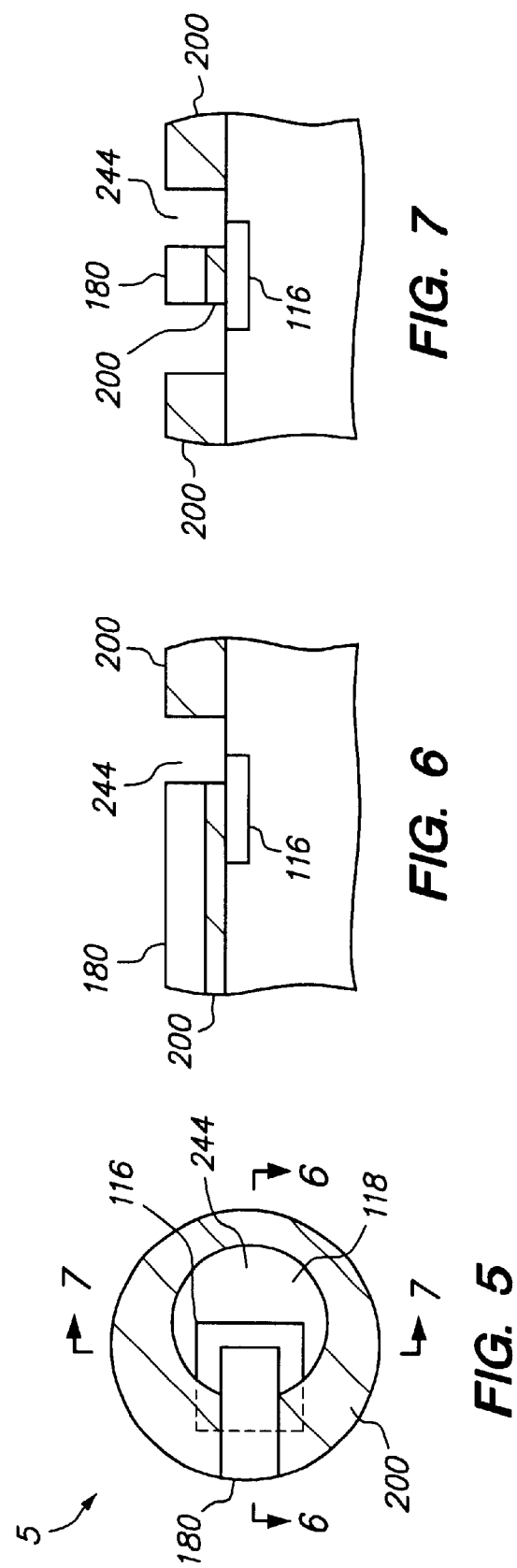

SEMICONDUCTOR MODULE WITH ENCAPSULANT BASE

BACKGROUND OF THE INVENTION

1. Field of the Invention

The present invention relates to semiconductor packaging, and more particularly to a semiconductor module.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as ball grid arrays (BGA) and chip scale packages (CSP) have been recently developed to address these considerations. Although these packages provide certain advantages, further size reduction and performance enhancement with these packages has been difficult to obtain due to physical dimension, design and manufacturing constraints.

Multichip modules (MCM) or-hybrid modules that package multiple chips on a common platform are an alternative to single-chip packages. These modules aim to achieve higher packaging density (lower volume and mass per chip), better signal integrity and reasonable manufacturing cost. Conventional multichip modules are essentially two-dimensional structures with multiple chips connected to a planar interconnection substrate which contains traces to supply power and signal transmission. Co-fired ceramic substrates have given way to organic-based substrates due to performance and cost advantages. However, since multichip modules utilize a planar interconnection substrate as the base, their effectiveness in packaging density is limited. For instance, a substrate transmission line that is 25 microns wide, 5 microns high and 10 millimeters long creates high line resistance and signal delays, which necessitates complex wiring rules in order to provide acceptable signal transmission distances and reasonable propagation delays.

Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and large cache memory devices which require high operating speed and high capacity in very limited space.

Three-dimensional packages generally follow two approaches. In one approach, individual chips are packaged in conventional single-chip packages and then the single-chip packages are vertically stacked and interconnected to one another. Single-chip packages stacked this way include thin small-outline packages (TSOP), ball grid arrays (BGA)

and tape chip packages (TCP), and chip connections within the single-chip packages include wire bonding, TAB and flip-chip bonding. In another approach, leads are connected to the chips, and then the exposed leaded chips are vertically stacked and interconnected to one another. Most three-dimensional packages involve peripheral interconnection, but some provide area array interconnection. Numerous three-dimensional packages are reported in the literature.

U.S. Pat. Nos. 5,484,959, 5,514,907, 5,625,221 and 5,744,827 disclose three-dimensional packages in which stacked single-chip packages have large footprints that require large amounts of space. The single-chip packages also have long extended leads and associated wire bonds that limit electrical performance.

U.S. Pat. Nos. 5,854,507 and 6,072,233 disclose three-dimensional packages with stacked single-chip packages in which solder balls provide the primary vertical interconnects. The solder balls require large amounts of space.

U.S. Pat. No. 5,394,303 discloses a three-dimensional package in which the stacked single-chip packages include a flexible film with wiring layers wrapped around the chip. The flexible film is relatively difficult to wrap and bending the wiring layers causes low yields.

U.S. Pat. Nos. 4,996,583, 5,138,438 and 5,910,685 disclose three-dimensional packages in which TAB leads are connected to and extend beyond the peripheries of the chips, the exposed chips are stacked together and the TAB leads are connected together. The TAB leads for different chips have different shapes and lengths which complicates manufacturing. Furthermore, the TAB leads are interconnected by applying thermocompression, which also complicates manufacturing.

U.S. Pat. Nos. 4,706,166 and 5,104,820 disclose three-dimensional packages in which chips are formed with leads that extend to the sidewalls, the exposed chips are stacked together, and then thin film routing lines are deposited on the sidewalls to interconnect the leads. The wafer process must be modified, and aligning the sidewalls and forming the routing lines on the leads is difficult.

U.S. Pat Nos. 4,897,708 and 4,954,875 disclose three-dimensional packages composed of wafers rather than individual chips. Cone-shaped vias are formed in the wafers, electrically conductive material is filled in the vias which contacts the pads on the wafers, and the wafers are stacked such that the electrically conductive material in the vias provides vertical interconnects between the pads. The wafer stacks are difficult to separate for repairs and too large for many applications.

Another drawback with many conventional three-dimensional packages is that the vertical interconnects lack the flexibility to accommodate thickness variations of the stacked assemblies. For instance, chip thickness may vary by 20 microns or more even after back-side wafer polishing attempts to planarize the wafer. As a result, vertical interconnects with fixed heights cannot adequately accommodate these thickness variations, and suffer from disoriented, cracked and open connections, high mechanical stress and reliability problems.

In summary, conventional three-dimensional packages suffer from numerous deficiencies including large area requirements, inflexible vertical interconnects, limited electrical performance, poor structural strength and low reliability. Moreover, conventional three-dimensional packages are often manufactured by complicated processes that are impractical for volume production, and too difficult and costly to develop.

In view of the various development stages and limitations in currently available three-dimensional packages, there is a need for a semiconductor module that is cost-effective, reliable, manufacturable, and provides excellent mechanical and electrical performance.

SUMMARY OF THE INVENTION

An object of the present invention is to provide a semiconductor module that provides a low cost, high performance, high reliability package. Another object of the present invention is to provide a convenient, cost-effective method of making a semiconductor module.

In accordance with one aspect of the invention, a semiconductor module includes a first semiconductor chip assembly, a second semiconductor chip assembly, an encapsulant base and an electrical interconnect. The first assembly includes a first semiconductor chip, a first conductive trace and a first connection joint, the first chip includes a first conductive pad, the first trace extends within and outside a periphery of the first chip, and the first connection joint contacts and electrically connects the first trace and the first pad. The second assembly includes a second semiconductor chip, a second conductive trace and a second connection joint, the second chip includes a second conductive pad, the second trace extends within and outside a periphery of the second chip, and the second connection joint contacts and electrically connects the second trace and the second pad. The encapsulant base is disposed between and in contact with the first and second chips and the first and second traces. The electrical interconnect contacts the first and second traces in a through-hole that extends through the encapsulant base and is located outside the peripheries of the chips, thereby electrically connecting the first and second traces.

Preferably, the first pad faces away from the second chip, the second pad faces away from the first chip, the first trace is a planar metal lead that overlaps the first pad and the second trace is a planar metal lead that overlaps the second pad.

It is also preferred that the encapsulant base is transfer molded plastic and the electrical interconnect is plated metal.

It is also preferred that the module is a dual in-line memory module that is devoid of wire bonds, TAB leads and solder joints.

In accordance with another aspect of the invention, a method of making a semiconductor module includes providing a first semiconductor chip assembly that includes a first semiconductor chip and a first carrier wherein the first chip includes a first conductive pad and the first carrier includes a first conductive trace, providing a second semiconductor chip assembly that includes a second semiconductor chip and a second carrier wherein the second chip includes a second conductive pad and the second carrier includes a second conductive trace, forming an encapsulant base between and in contact with the first and second assemblies, forming a through-hole that extends through the carriers and the encapsulant base and is located outside the peripheries of the first and second chips, forming an electrical interconnect in the through-hole that contacts the first and second traces in the through-hole, and forming first and second connection joints wherein the first connection joint contacts and electrically connects the first trace and the first pad and the second connection joint contacts and electrically connects the second trace and the second pad.

Preferably, the encapsulant base is formed by transfer molding and contacts the first and second chips, the through-hole is formed by mechanical drilling, the electrical interconnect is formed by electroless plating followed by electroplating, and the connection joints are formed by electroless plating.

It is also preferred that an attachment joint mechanically attaches the first and second assemblies before the encapsulant base is formed, and the attachment joint is removed after the encapsulant base is formed. For instance, the first carrier can be bent at opposing lateral ends to form a pair of legs that extend across a-thickness of the first chip, the carriers can be positioned so that the legs extend across a thickness of the second chip and contact the second carrier, and then the attachment joint can be formed by welding the legs to the second carrier.

It is also preferred that the steps after providing the first and second assemblies are performed in the sequence set forth.

An advantage of the semiconductor module of the present invention is that it is reliable, cost-effective, easily manufacturable, contains ultra-thin semiconductor chip assemblies in an integrated module, and can be directly mounted on a printed circuit board. Another advantage is that the encapsulant base provides both encapsulation for the chips and mechanical support for the module. Another advantage is that the module can accommodate chips with varying sizes and thickness while maintaining reliable vertical electrical interconnects between the chips.

Another advantage is that the module is well-suited for severe operational conditions due to low stress at the vertical electrical interconnects and short signal paths between the chips. Another advantage is that the module can be manufactured using low temperature processes which reduces stress and improves reliability. A further advantage is that the module can be manufactured using well-controlled processes which can be easily implemented by circuit board, lead frame and tape manufacturers.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIG. 5 is an enlarged plan view of encircled detail 5 in FIG. 1S;

FIGS. 6 and 7 are enlarged cross-sectional views taken along lines 6—6 and 7—7, respectively, in FIG. 5;

DETAILED DESCRIPTION OF THE PREFERRED EMBODIMENTS

Figure 1D:
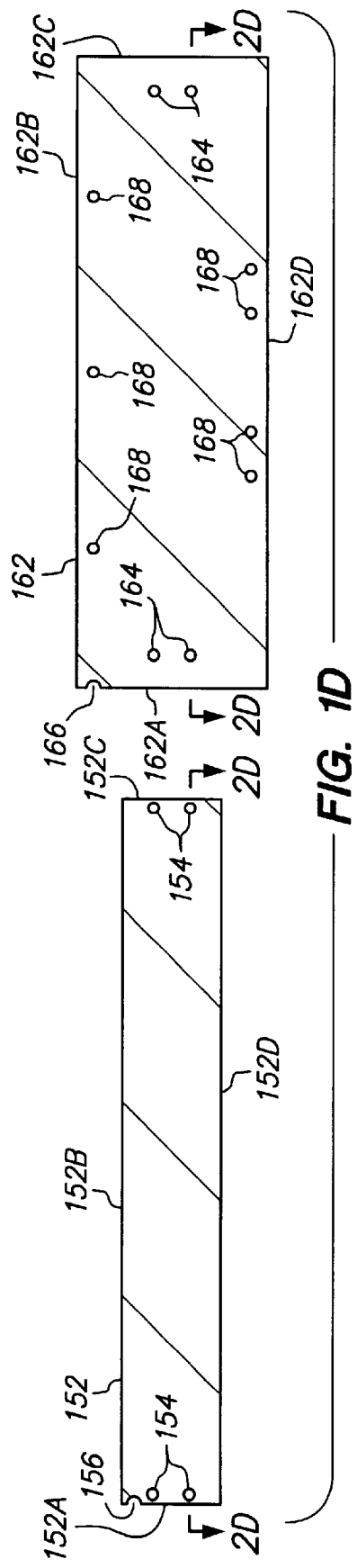
FIGS. 1A–1X are top plan views showing a method of making a semiconductor module in accordance with an embodiment of the present invention.

FIGS. 1A–1X, 2A–2X and 3A–3X are top, cross-sectional and bottom views, respectively, of a method of making a semiconductor module in accordance with an embodiment of the present invention.

FIGS. 1A, 2A, and 3A are top, cross-sectional and bottom views, respectively, of semiconductor chip 110 and integrated capacitor chip 120.

Semiconductor chip 110 is an integrated circuit in which various transistors, circuits, interconnect lines and the like are formed (not shown). Chip 110 includes opposing major surfaces 112 and 114 and has a thickness of 200 microns between these surfaces. Surface 112 is the active surface and includes eight conductive pads 116 and passivation layer 118. Pads 116 are substantially aligned with passivation layer 118 so that surface 112 is essentially flat. Alternatively, if desired, pads 116 can extend above or be recessed below passivation layer 118. Pads 116 provides bonding sites to electrically couple chip 110 with external circuitry. Thus, a particular pad 116 can be input/output pad or a power/ground pad. Pads 116 have a length and width of 70 microns.

Pads 116 have aluminum bases that are cleaned by dipping chip 110 in a solution containing 0.05 M phosphoric acid at room temperature for 1 minute and then rinsed in distilled water. Thereafter, pads 116 are treated to provide surface layers that will accommodate subsequently formed connection joints. Pads 116 can be treated by depositing several metal layers, such as chromium/copper/gold or titanium/nickel/gold on the aluminum bases. The chromium or titanium layer provides a barrier for the aluminum base and an adhesive between the overlaying metal and the aluminum base. The metal layers, however, are typically selectively deposited by evaporation or electroplating using a mask which is a relatively complicated process. Alternatively, pads 116 can be treated by forming nickel surface layers on the aluminum bases. For instance, chip 110 is dipped in a zinc solution to deposit a zinc layer on the aluminum bases. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum bases dissolve. Thereafter, nickel surface layers are electrolessly deposited on the zincated aluminum bases. A suitable electroless nickel plating solution is Enthone Enplate NI-424 at 85° C.

Integrated capacitor chip 120 is an integrated circuit which a capacitor is formed (not shown). Chip 120 includes opposing major surfaces 122 and 124 and has a thickness of 200 microns between these surfaces. Surface 122 is the active surface and includes two conductive pads 126 and passivation layer 128. Pads 126 are substantially aligned with passivation layer 128 so that surface 122 is essentially flat and have a length and width of 70 microns. Pads 126 (like pads 116) includes aluminum bases that are treated to include metallic surface layers that are more accommodating to subsequently formed connection joints.

FIGS. 1B, 2B, and 3B are top, cross-sectional and bottom views, respectively, of metal bases 130 and 140. Metal base 130 includes opposing major surfaces 132 and 134, and metal base 140 includes opposing major surfaces 142 and 144. Metal bases 130 and 140 are copper foils with a thickness of 127 microns.

FIGS. 1C, 2C, and 3C are top, cross-sectional and bottom views, respectively, of photoresist layers 150 and 160 formed on metal bases 130 and 140, respectively. Photoresist layers 150 and 160 are deposited as continuous dry films and then patterned by selectively applying light through respective reticles (not shown), applying a developer solution to remove the photoresist portions rendered soluble by the light, and then hard baking, as is conventional. As a result, photoresist layer 150 contains openings that selectively expose portions of surface 132, and photoresist layer 160 contains openings that selectively expose portions of surface 142. Photoresist layers 150 and 160 have a thickness of 15 microns.

Figure 2D:
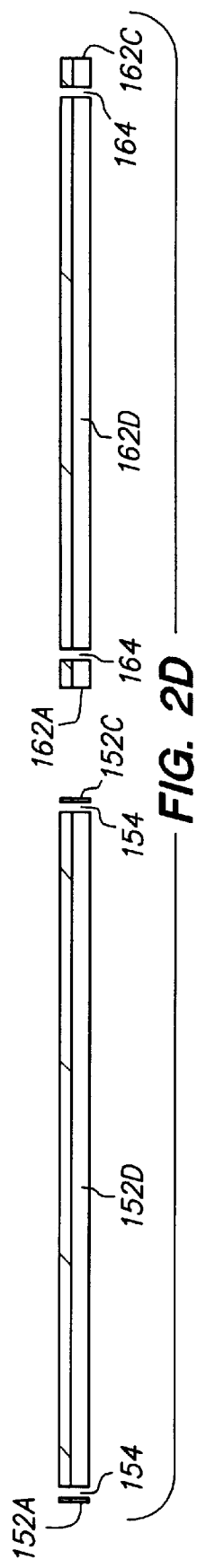
FIGS. 2A–2X are cross-sectional views corresponding to FIGS. 1A–1X, respectively.
Figure 3D:
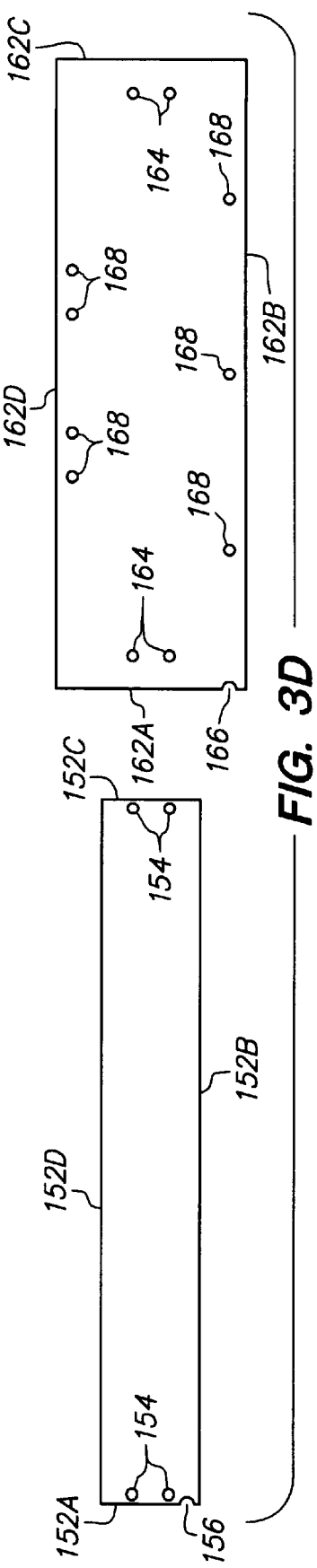
FIGS. 3A–3X are bottom plan views corresponding to FIGS. 1A–1X, respectively.

FIGS. 1D, 2D, and 3D are top, cross-sectional and bottom views, respectively, of various features formed in metal bases 130 and 140 by wet chemical etching using photoresist layers 150 and 160 as etch masks. In particular, outer edges 152, alignment holes 154 and fiducial index 156 are formed in metal base 130 by applying a front-side wet chemical etch through the openings in photoresist layer 150 to the exposed portions of surface 132 without applying the wet chemical etch to the back-side surface 134. For instance, the wet chemical etch can be sprayed on photoresist layer 150, or surface 134 can be covered by a mask and then the structure can be dipped in the wet chemical etch. Similarly, outer edges 162, alignment holes 164, fiducial index 166 and tooling holes 168 are formed in metal base 140 by applying a front-side wet chemical etch through the openings in photoresist layer 160 to the exposed portions of surface 142 without applying the wet chemical etch to the back-side surface 144. For instance, the wet chemical etch can be sprayed on photoresist layer 160, or surface 144 can be covered by a mask and then the structure can be dipped in the wet chemical etch. Thus, outer edges 152 and 162, alignment holes 154 and 164, fiducial indexes 156 and 166 and tooling holes 168 are formed subtractively.

Metal base 130 has a length of 200 mm between outer edges 152A and 152C and a width of 37 mm between outer edges 152B and 152D, alignment holes 154 have a diameter of 1.524 mm, and fiducial index 156 is a C-shaped notch located in outer edge 152A with a diameter of 1.524 mm.

Metal base 140 has a length of 213 mm between outer edges 162A and 162C and a width of 67 mm between outer edges 162B and 162D, alignment holes 164 and tooling holes 168 have a diameter of 1.524 mm, and fiducial index 166 is a C-shaped notch located in outer edge 162A with a diameter of 1.524 mm.

Suitable wet chemical etches can be provided by solutions containing alkaline ammonia, sulfuric acid with hydrogen peroxide, chromic-sulfuric acid, phosphoric acid with ammonium persulfate, copper sulfate, copper chloride or ferric chloride. The optimal etch times for exposing metal bases 130 and 140 to the wet chemical etches can be established through trial and error.

Figure 1E:
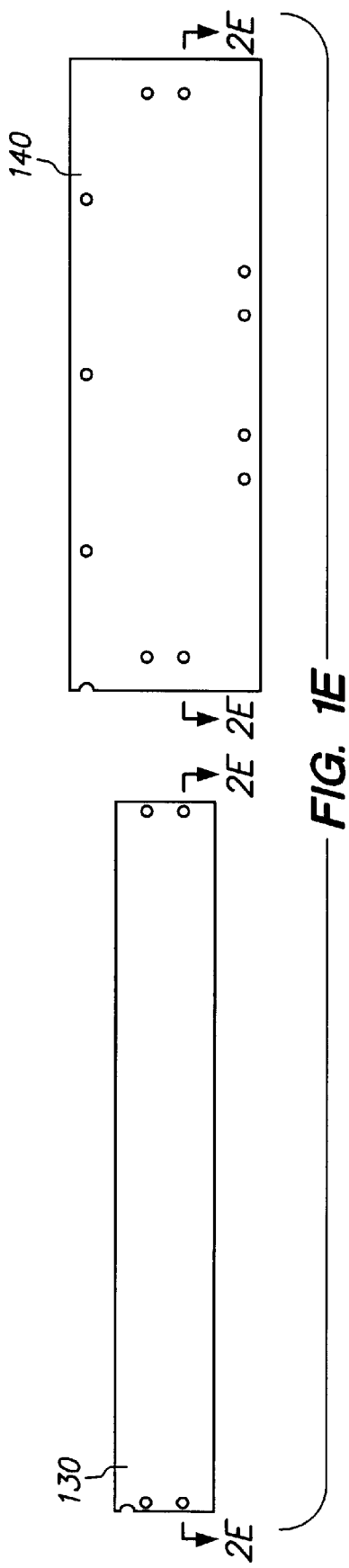
Figure 2E:
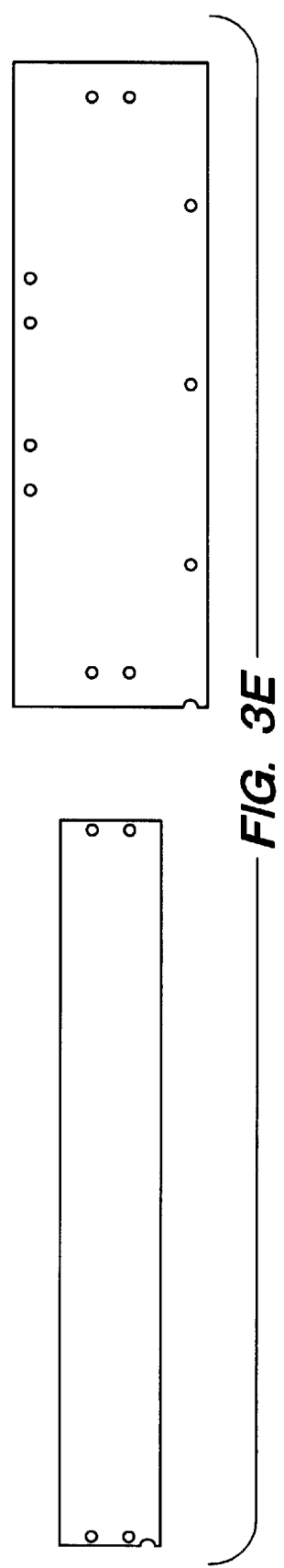
Figure 3E:
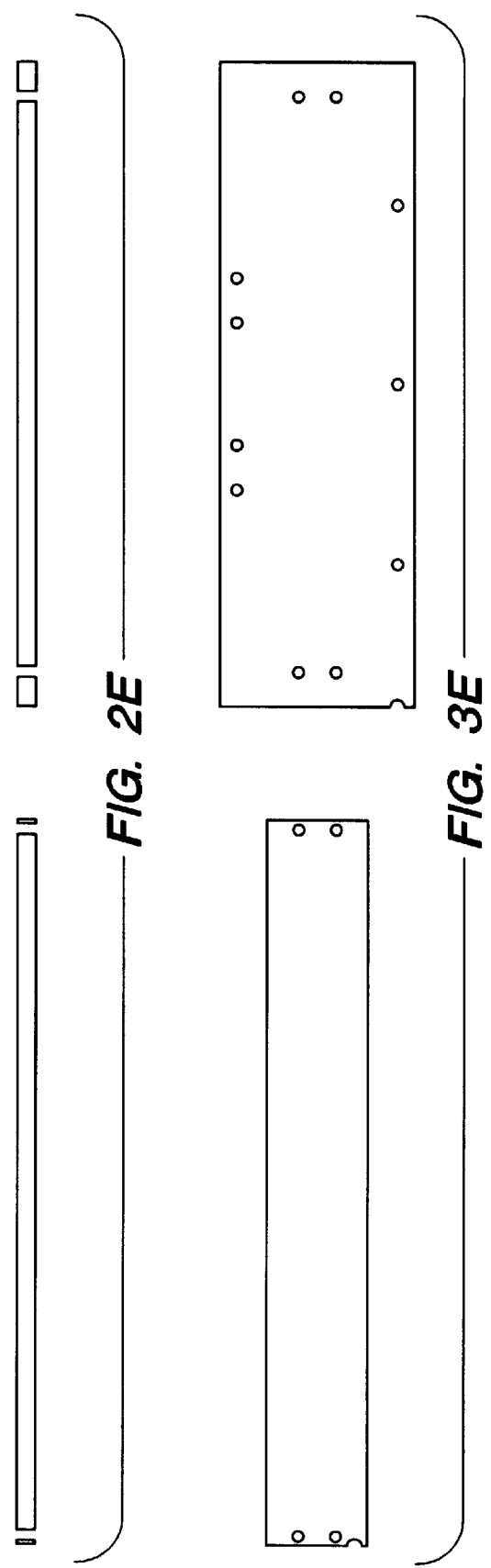

FIGS. 1E, 2E, and 3E are top, cross-sectional and bottom views, respectively, of metal bases 130 and 140 after photoresist layers 150 and 160 are stripped.

FIGS. 1F, 2F, and 3F are top, cross-sectional and bottom views, respectively, of photoresist layers 170 and 172 formed on metal base 130, and photoresist layers 174 and 176 formed on metal base 140. Photoresist layers 170, 172, 174 and 176 are deposited as continuous dry films and then patterned by selectively applying light through respective reticles (not shown), applying a developer solution to remove the photoresist portions rendered soluble by the light, and then hard baking, as is conventional. As a result, photoresist layers 170, 172, 174 and 176 contain openings that selectively expose portions of surfaces 132, 134, 142 and 144, respectively. Photoresist layers 170, 172, 174 and 176 have a thickness of 15 microns.

FIGS. 1G, 2G, and 3G are top, cross-sectional and bottom views, respectively, of conductive traces 180, finger portions 182 and 184 and drill hole indexes 186 formed on metal base 130, and conductive traces 190 and finger portions 192 and 194 formed on metal base 140.

Conductive traces 180 and finger portions 182 are formed in the openings in photoresist layer 170 and on the exposed portions of surface 132 of metal base 130, finger portions 184 and drill hole indexes 186 are formed in the openings in photoresist layer 172 and on the exposed portions of surface 134 of metal base 130, conductive traces 190 and finger portions 192 are formed in the openings in photoresist layer 174 and on the exposed portions of surface 142 of metal base 140, and finger portions 194 are formed in the openings in photoresist layer 176 and on the exposed portions of surface 144 of metal base 140.

Conductive traces 180 are connected to finger portions 182 in one-to-one relation. That is, each conductive trace 180 is connected to an associated finger portion 182. For convenience of illustration, the portions of conductive traces 180 that extend to and connect to finger portions 182 are not shown, and likewise, the corresponding openings in photoresist layer 170 are not shown. Conductive traces 180 proximate to outer edges 152A and 152C include elongated routing portions 180A and enlarged circular capture pads 180B, and the other conductive traces 180 (between those with capture pads 180B) consist of routing portions 180A. Capture pads 180B are vertically aligned with and have identical shapes and sizes to drill hole indexes 186. Thus, capture pads 180B and drill hole indexes 186 are mirror images of one another that extend from opposite sides of metal base 130. Finger portions 182 and 184 are located proximate to outer edge 152B. Furthermore, finger portions 182 and 184 are vertically aligned with one another and have identical shapes and sizes. Thus, finger portions 182 and 184 are mirror images of one another that extend from opposite sides of metal base 130.

Conductive traces 190 are connected to finger portions 192 in one-to-one relation. That is, each conductive trace 190 is connected to an associated finger portion 192. For convenience of illustration, the portions of conductive traces 190 that extend to and connect to finger portions 192 are not shown, and likewise, the corresponding openings in photoresist layer 174 are not shown. Conductive traces 190 proximate to outer edges 162A and 162C include elongated routing portions 190A and enlarged circular capture pads 190B, and the other conductive traces 190 (between those with capture pads 190B) consist of routing portions 190A. Finger portions 192 and 194 are located proximate to outer edge 162B. Furthermore, finger portions 192 and 194 are vertically aligned with one another and have identical shapes and sizes. Thus, finger portions 192 and 194 are mirror images of one another that extend from opposite sides of metal base 140.

Conductive traces 180, finger portions 182 and 184 and drill hole indexes 186 are electroplated onto metal base 130. Conductive traces 180, finger portions 182 and 184 and drill hole indexes 186 are composed of a first nickel layer electroplated onto metal base 130, a copper layer electroplated onto the first nickel layer, and a second nickel layer electroplated onto the copper layer. Thus, the first nickel layer is sandwiched between and contacts metal base 130 and the copper layer, the copper layer is sandwiched between and contacts the first and second nickel layers, and the second nickel layer contacts the copper layer and is exposed. The first and second nickel layers and the copper layer are shown as a single layer for convenience of illustration.

Conductive traces 190 and finger portions 192 and 194 are electroplated onto metal base 140. Conductive traces 190 and finger portions 192 and 194 are composed of a first nickel layer electroplated onto metal base 140, a copper layer electroplated onto the first nickel layer, and a second nickel layer electroplated onto the copper layer. Thus, the first nickel layer is sandwiched between and contacts metal base 130 and the copper layer, the copper layer is sandwiched between and contacts the first and second nickel layers, and the second nickel layer contacts the copper layer and is exposed. The first. and second nickel layers and the copper layer are shown as a single layer for convenience of illustration.

Conductive traces 180, finger portions 182 and 184 and drill hole indexes 186 are simultaneously formed by an electroplating operation. Thus, conductive traces 180, finger portions 182 and 184 and drill hole indexes 186 are formed additively. Initially, a plating bus (not shown) is connected to metal base 130 at plating regions 188, current is applied to the plating bus from an external power source, and metal base 130 is submerged in an electrolytic nickel plating solution such as Technic Tehni Nickel "S" at room temperature. As a result, the first nickel layer electroplates (deposits or grows) on the exposed portions of surfaces 132 and 134. The nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Tehni Nickel "S" at room temperature while current is applied to the plating bus to electroplate the second nickel layer on the copper layer. The nickel electroplating operation continues until the second nickel layer has the desired thickness. Thereafter, the structure is removed from the electrolytic nickel plating solution and rinsed in distilled water to remove contaminants.

Conductive traces 190 and finger portions 192 and 194 are simultaneously formed by a nickel/copper/nickel electroplating operation similar to that described for conductive traces 180, finger portions 182 and 184 and drill hole indexes 186.

Conductive traces 180, finger portions 182 and 184, drill hole indexes 186, conductive traces 190 and finger portions 192 and 194 have a thickness of 10 microns provided by a first nickel layer with a thickness of 1 micron, a copper layer with a thickness of 8 microns, and a second nickel layer with a thickness of 1 micron. Routing portions 180A and 190A have a width (orthogonal to an elongated length) of 35 microns, capture pads 180B and 190B and drill hole indexes 186 have a diameter of 550 microns, and finger portions 182, 184, 192 and 194 have a length (perpendicular to outer edges 152B and 162B) of 100 microns and a width (parallel to outer edges 152B and 162B) of 39 microns.

Figure 4:
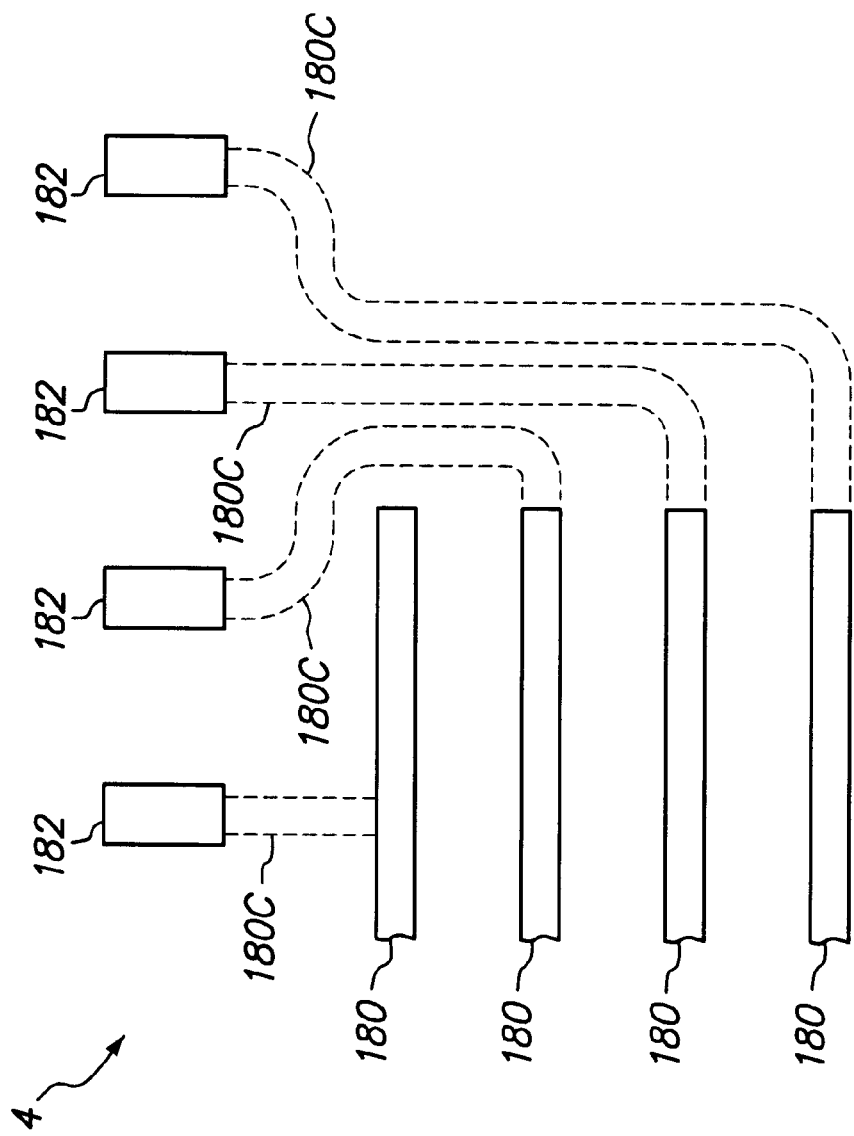
FIG. 4 is an enlarged plan view of encircled detail 4 in FIG. 1G.
Figure 10:
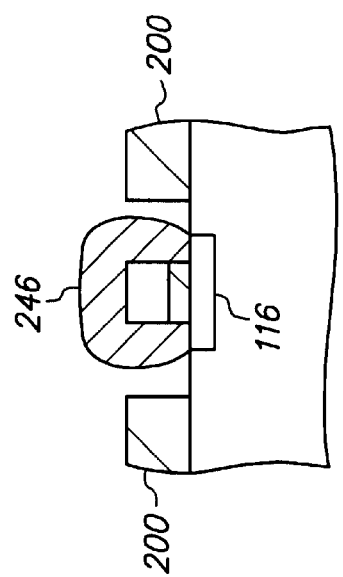

FIG. 4 is an enlarged plan view of encircled detail 4 in FIG. 1G that depicts representative conductive traces 180 and finger portions 182 in greater detail. Conductive traces 180 include supplemental routing portions 180C (shown in phantom) that extend to and connect to finger portions 182. Supplemental routing portions 180C not shown in the other figures for convenience of illustration. However, supplemental routing portions 180C are present for all conductive traces 180, as are similar supplemental routing portions for all conductive traces 190.

FIGS. 1H, 2H, and 3H are top, cross-sectional and bottom views, respectively, of metal bases 130 and 140, conductive traces 180, finger portions 182 and 184, drill hole indexes 186, conductive traces 190 and finger portions 192 and 194 after photoresist layers 170, 172, 174 and 176 are stripped.

FIGS. 1I, 2I, and 3I are top, cross-sectional and bottom views, respectively, of adhesives 200 formed on metal base 130 and conductive traces 180 and adhesives 202 formed on metal base 140 and conductive traces 190. Adhesives 200 and 202 may include an organic surface protectant such as HK 2000 which is promptly applied to metal bases 130 and 140, conductive traces 180, finger portions 182 and 184, drill hole indexes 186, conductive traces 190 and finger portions 192 and 194 after photoresist layers 170, 172, 174 and 176 are stripped to reduce native oxide formation on the exposed surfaces. The use of organic surface protectant layers in insulative adhesives for semiconductor chip assemblies is well-known in the art. Thereafter, a liquid resin (A stage) epoxy is applied over predetermined portions of the metal bases 130 and 140 and conductive traces 180 and 190 using stencil printing. The liquid resin does not contact or overlap capture pads 180A, finger portions 182, capture pads 190A and finger portions 192. The liquid resin has a thickness of 30 microns.

Figure 1J:
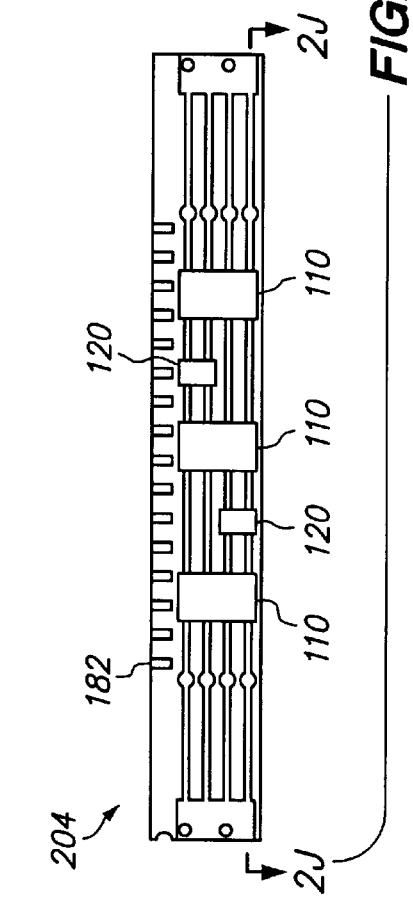
Figure 2J:
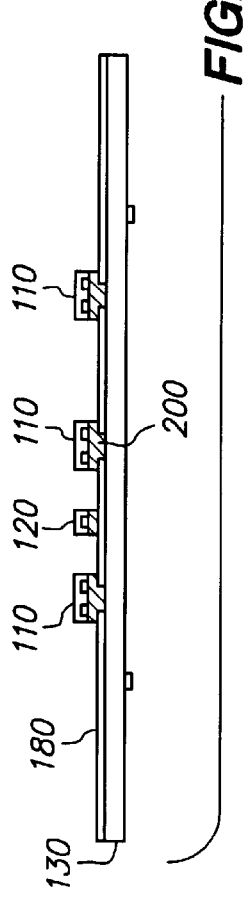
Figure 3J:
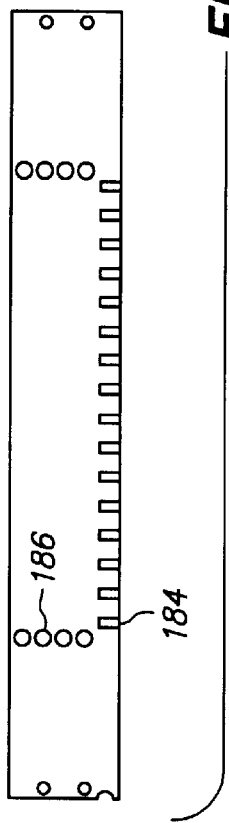
Figure 2J:
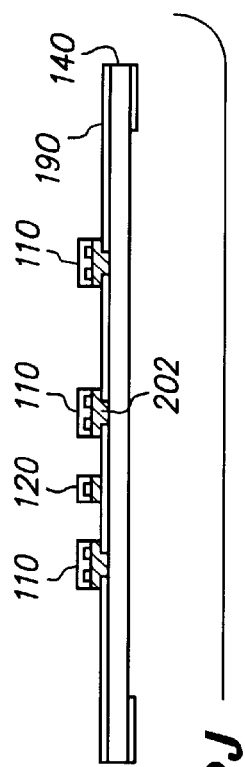
Figure 3J:
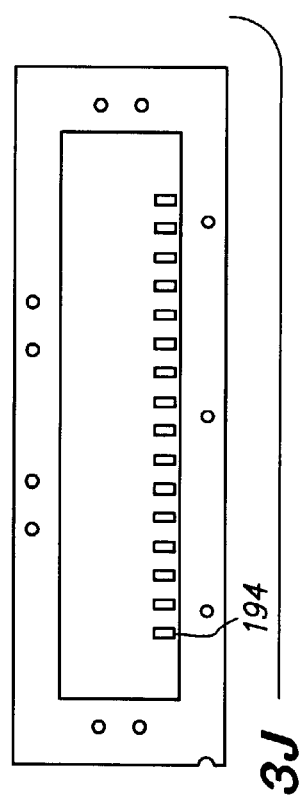

FIGS. 1J, 2J, and 3J are top, cross-sectional and bottom views, respectively, of chips 110 and 120 mechanically attached to metal base 130 and conductive traces 180 by adhesives 200, and chips 110 and 120 mechanically attached to metal base 140 and conductive traces 190 by adhesives 202. Multiple chips 110 and 120 are employed.

Adhesives 200 are disposed between and contact surfaces 112 of chips 110 and metal base 130, are disposed between and contact surfaces 112 of chips 110 and conductive traces 180, are disposed between and contact surfaces 122 of chips 120 and metal base 130, and are disposed between and contact surfaces 122 of chips 120 and conductive traces 180. Thus, surfaces 112 of chips 110 and surfaces 122 of chips 120 face towards metal base 130 and conductive traces 180 and are covered, and surfaces 114 of chips 110 and surfaces 124 of chips 120 face away from metal base 130 and conductive traces 180 and are exposed. In addition, chips 110 and metal base 130 do not contact one another, chips 110 and conductive traces 180 do not contact one another, chips 120 and metal base 130 do not contact one another, and chips 120 and conductive traces 180 do not contact one another.

Adhesives 202 are disposed between and contact surfaces 112 of chips 110 and metal base 140, are disposed between and contact surfaces 112 of chips 110 and conductive traces 190, are disposed between and contact surfaces 122 of chips 120 and metal base 140, and are disposed between and contact surfaces 122 of chips 120 and conductive traces 190. Thus, surfaces 112 of chips 110 and surfaces 122 of chips 120 face towards metal base 140 and conductive traces 190 and are covered, and surfaces 114 of chips 110 and surfaces 124 of chips 120 face away from metal base 140 and conductive traces 190 and are exposed. In addition, chips 110 and metal base 140 do not contact one another, chips 110 and conductive traces 190 do not contact one another, chips 120 and metal base 140 do not contact one another, and chips 120 and conductive traces 190 do not contact one another.

Chips 110 and adhesives 200; and chips 120 and adhesives 200 are positioned relative to one another so that chips 110 and 120 are disposed within the surface areas of adhesives 200, conductive traces 180 overlap and are electrically isolated from pads 116 and 126, conductive traces 180 extend within and outside the peripheries of chips 110 and 120, and capture pads 180A, finger portions 182 and 184 and drill hole indexes 186 are disposed outside the peripheries of chips 110 and 120. Chips 110 and,conductive traces 180, and chips 120 and conductive traces 180 can be aligned using an automated pattern recognition system. Adhesives 200 are sandwiched between chips 110 and metal base 130, chips 110 and conductive traces 180, chips 120 and metal base 130 and chips 120 and conductive traces 180 using relatively low pressure. Thereafter, adhesives 200 are heated and fully cured (C stage) at relatively low temperature in the range of 200 to 250° C. to form solid adhesive electrically insulative thermosetting epoxy die attaches that mechanically fasten chips 110 and 120 to metal base 130 and conductive traces 180. Adhesives 200 are 3 microns thick between pads 116 and conductive traces 180, and between pads 126 and conductive traces 180.

Chips 110 and adhesives 202, and chips 120 and adhesives 202 are positioned relative to one another so that chips 110 and 120 are disposed within the surface areas of adhesives 202, conductive traces 190 overlap and are electrically isolated from pads 116 and 126, conductive traces 190 extend within and outside the peripheries of chips 110 and 120, and capture pads 190A and finger portions 192 and 194 are disposed outside the peripheries of chips 110 and 120. Chips 110 and conductive traces 190, and chips 120 and conductive traces 190 can be aligned using an automated pattern recognition system. Adhesives 202 are sandwiched between chips 110 and metal base 140, chips 110 and conductive traces 190, chips 120 and metal base 140 and chips 120 and conductive traces 190 using relatively low pressure. Thereafter, adhesives 202 are heated and fully cured (C stage) at relatively low temperature in the range of 200 to 250° C. to form solid adhesive electrically insulative thermosetting epoxy die attaches that mechanically fasten chips 110 and 120 to metal base;140 and conductive traces 190. Adhesives 202 are 3 microns thick between pads 116 and conductive traces 190, and between pads 126 and conductive traces 190.

At this stage, semiconductor chip assembly 204 includes chips 110 and 120, metal base 130, conductive traces 180, finger portions 182 and 184, drill hole indexes 186 and adhesives 200, and semiconductor chip assembly 206 includes chips 110 and 120, metal base 140, conductive traces 190, finger portions 192 and 194 and adhesives 202. Metal base 130 and conductive traces 180 provide a carrier for chips 110 and 120 in assembly 204, and metal base 140 and conductive traces 190 provide a carrier for chips 110 and 120 in assembly 206.

FIGS. 1K, 2K, and 3K are top, cross-sectional and bottom views, respectively, of legs 210 formed in metal base 130. Legs 210 include vertical supports 212 and horizontal tabs 214. Legs 210 are simultaneously formed by bending metal base 130 at two comers proximate to outer edge 152A and two comers proximate to outer edge 152C. Thus, the outer comers are located between vertical supports 212 and horizontal tabs 214, and the inner corners are located between vertical supports 212 and central portion 216 of metal base 130. The comers are bent at about 60 degree angles such that vertical supports 212 are sloped and extend away from central portion 216 with increasing vertical distance from central portion 216, and horizontal tabs 214 are parallel to central portion 216. Thus, legs 210 provide a pair of opposing downsetted edges for metal base 130. Legs 210 have a height (across vertical supports 212) of 1.2 mm, and a length (across horizontal tabs 214) of 5 mm. Alignment holes 154 are contained in horizontal tabs 214.

FIGS. 1L, 2L, and 3L are top, cross-sectional and bottom views, respectively, of assemblies 204 and 206 positioned relative to one another. In particular, assembly 204 is inverted by being flipped lengthwise and placed on assembly 206 such that alignment holes 154 and 164 are aligned with one another. That is, alignment holes 154 near outer edge 152A are aligned with alignment holes 164 near outer edge 162C, and alignment holes 154 near outer edge 152C are aligned with alignment holes 164 near outer edge 162A. As a result, chips 110 attached to metal base 130 are aligned-with chips 110 attached to metal base 140, although chips 120 attached to metal base 130 are not aligned with chips 120 attached to metal base 140. Furthermore, finger portions 182 and 184 are aligned with finger portions 192 and 194, and capture pads 180B and drill hole indexes 186 are aligned with capture pads 190B. In addition, the structure defines chamber 218 that is bounded from above and at two opposing outer edges by assembly 204, bounded from below by assembly 206, and open at two opposing outer edges between legs 210. Within chamber 218, surfaces 114 and the outer edges of chips 110, surfaces 124 and the outer edges of chips 120, metal bases 130 and 140, conductive traces 180 and 190, finger portions 182 and 192, and adhesives 200 and 202 are exposed. Chamber 218 has sufficient height to allow vertical clearance between chips 110 and 120 in assembly 204 and chips 110 and 120 in assembly 206.

Figure 1J:
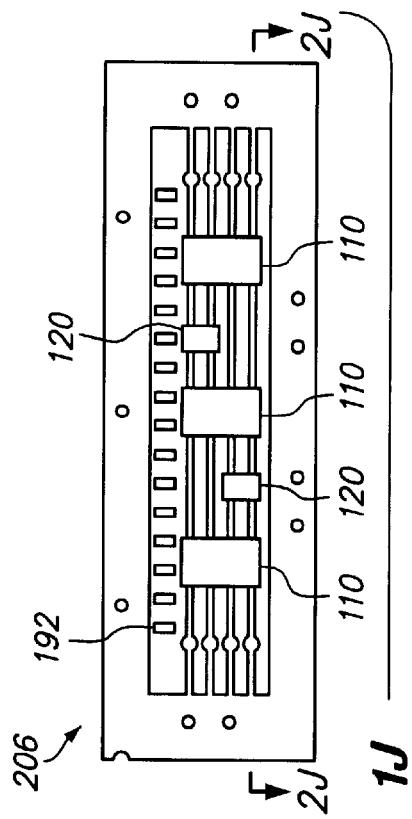
Figure 1M:
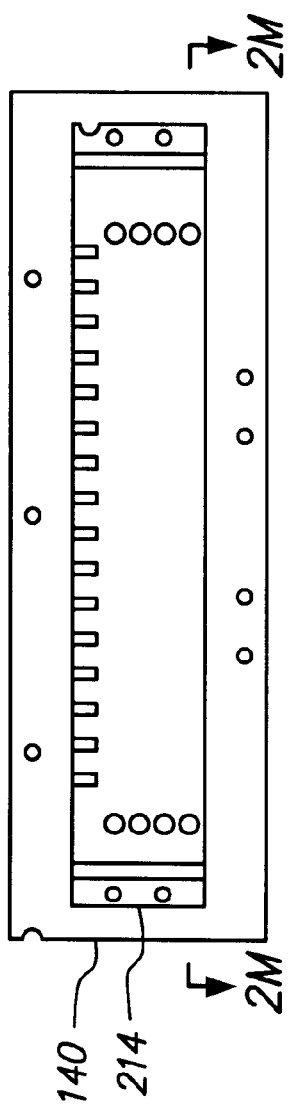
Figure 2M:
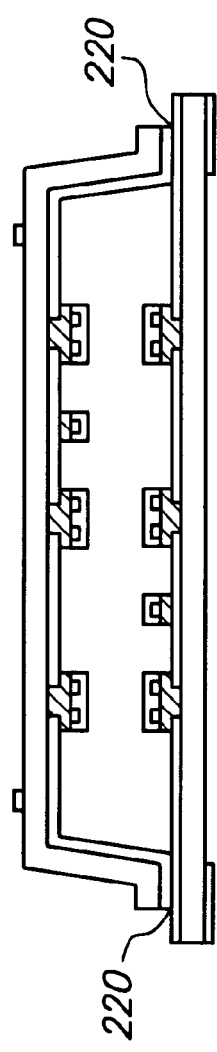
Figure 3M:
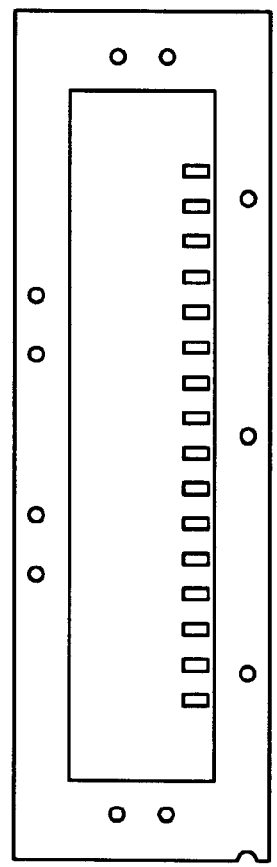

FIGS. 1M, 2M, and 3M are top, cross-sectional and bottom views, respectively, of assemblies 204 and 206 mechanically attached to one another by attachment joints 220. Attachment joints 220 are provided by welding horizontal tabs 214 to the underlying portions of metal base 140.

Figure 1N:
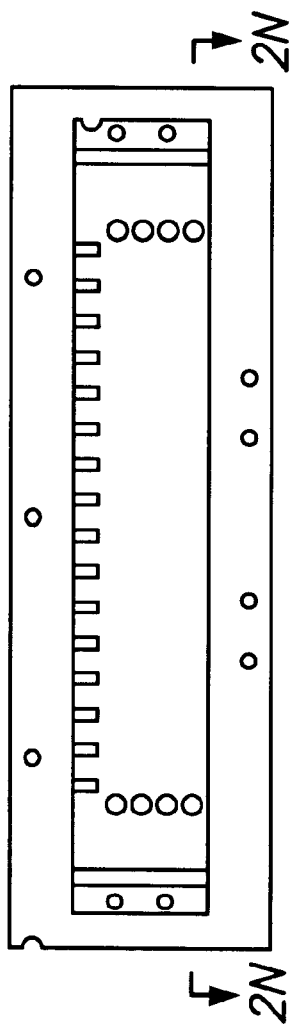
Figure 2N:
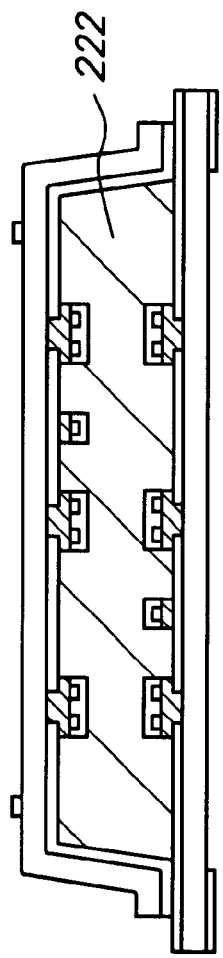
Figure 3N:
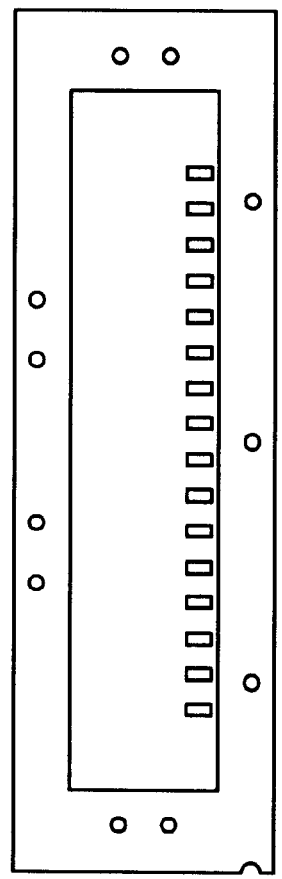

FIGS. 1N, 2N and 3N are top, cross-sectional and bottom views, respectively, of encapsulant base 222 formed in chamber 218 by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art. The structure is accurately positioned within the mold cavity using tooling holes 168 for alignment. Next, encapsulant base 222 is introduced into chamber 218 as a liquid resin and then hardened to form a solid single-piece molded plastic base during the transfer molding operation. Encapsulant base 222 completely fills chamber 218 and contacts all exposed surfaces within chamber 218. Thus, encapsulant base 222 contacts surfaces 114 and the outer edges of chips 110, surfaces 124 and the outer edges of chips 120, metal bases 130 and 140, conductive traces 180 and 190, finger portions 182 and 192, and adhesives 200 and 202 within chamber 218. Encapsulant base 222 also extends slightly outside chamber 218 near the previously open outer edges between legs 210. As a result, chips 110 and 120 are embedded within encapsulant base 222, and the combination of adhesives 200 and 202 and encapsulant base 222 completely surrounds and seals chips 110 and 120. Encapsulant base 222 is a rigid adherent insulative protective layer that provides back-side environmental protection such as moisture resistance and particle protection for chips 110 and 120 as well as mechanical support for the structure.

FIGS. 1O, 2O and 3O are top, cross-sectional and bottom views, respectively, of through-holes 224 formed in the structure. Through-holes 224 are openings formed by mechanically drilling through drill hole indexes 186, metal base 130, capture pads 180B, encapsulant base 222, capture pads 190B and metal base 140, in that order. The mechanical drilling is initially applied to drill hole indexes 186 using drill hole indexes 186 as registration points and continues until through-holes 224 extend completely through the structure. Through-holes 224 have straight vertical sidewalls, have a diameter of 300 microns and are axially centered within drill hole indexes 186 and capture pads 180B and 190B. Thus, through-holes 224 have sidewalls that are laterally spaced from the outer edges of drill hole indexes 186 and capture pads 180B and 190B by 125 microns ((550−300)/2). Furthermore, through-holes 224 expose conductive traces 180 and 190 along the sidewalls at capture pads 180B and 190B, respectively. Advantageously, capture pads 180B and 190B are large enough to accommodate tolerance variations in the position of the mechanical drilling to assure that through-holes 224 expose conductive traces 180 and 190, respectively.

Figure 1P:
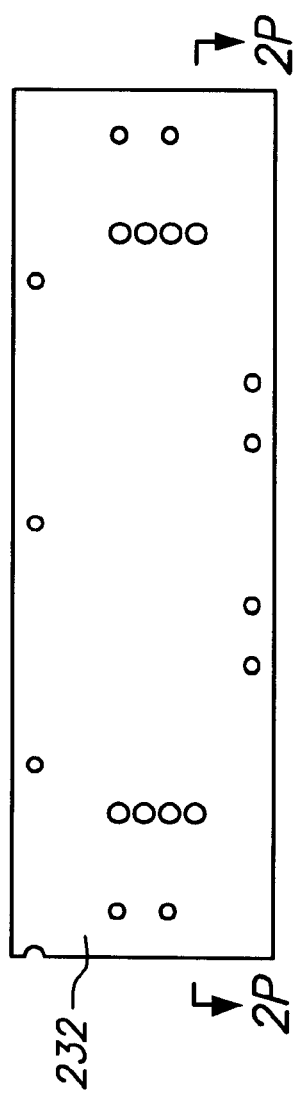
Figure 2P:
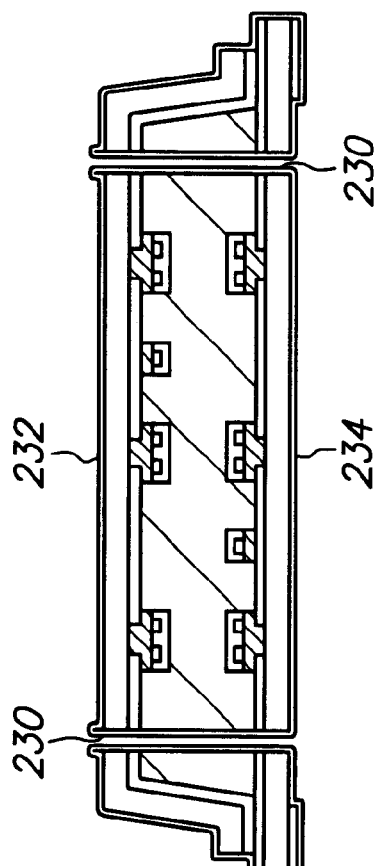
Figure 3P:
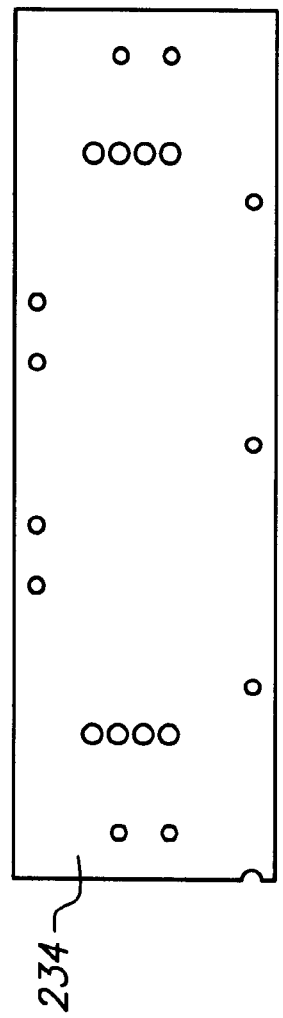

FIGS. 1P, 2P and 3P are top, cross-sectional and bottom views, respectively, of electrical interconnects 230, metal layer 232 and metal layer 234 formed on the structure. Electrical interconnects 230 are formed in through-holes 224, metal layer 232 is formed on metal base 130, finger portions 184 and drill hole indexes 186, and metal layer 234 is formed on metal base 140 and finger portions 194.

Electrical interconnects 230 are formed on all sidewall portions of through-holes 224. Thus, electrical interconnects 230 contact metal bases 130 and 140, conductive traces 180 and 190, drill hole indexes 186 and encapsulant base 222 within through-holes 224. As a result, electrical interconnects 230 electrically connect conductive traces 180 and 190 in through-holes 224. Metal layer 232 contacts the exposed portions of metal base 130, finger portions 184 and drill hole indexes 186 outside through-holes 224, and metal layer 234 contacts the exposed portions of metal base 140 and finger portions 194 outside through-holes 224.

Electrical interconnects 230 include a first copper layer deposited on metal bases 130 and 140, conductive traces 180 and 190, drill hole indexes 186 and encapsulant base-222 within through-holes 224, and a second copper layer deposited on the first copper layer. Similarly, metal layer 232 includes a first copper layer deposited on metal base 130, finger portions 184 and drill hole indexes 186 and a second copper layer deposited on the first copper layer, and metal layer 234 includes a first copper layer deposited on metal base 140 and finger portions 194 and a second copper layer deposited on the first copper layer. For convenience of illustration, the first and second copper layers are shown as a single layer. The first copper layer is 0.5 microns thick, and the second copper layer is 24.5 microns thick. Hence, electrical interconnects 230 and metal layers 232 and 234 have a thickness of 25 microns. Likewise, of the diameter of through-holes 224 is narrowed to 250 microns (300−(2*25)).

Electrical interconnects 230 and metal layers 232 and 234 are formed by an electroless plating operation followed by an electroplating operation.

Electroless plating provides metal deposition by an exchange reaction between metal complexes in a solution and a catalytic metal that activates or initiates the reaction. As a result, the electroless metal continually plates (i.e., deposits or grows) on the catalytic metal. The reaction does not require externally applied electric current, and therefore electroless plating can proceed without a plating bus. Metal bases 130 and 140, conductive traces 180 and 190 and drill hole indexes 186 include copper and therefore are catalytic to electroless copper. However, encapsulant base 222 needs to be rendered catalytic to electroless copper before the electroless plating operation begins. To accomplish this, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATAPOSIT™. Palladium becomes trapped in the exposed surfaces of encapsulant base 222, thereby providing a nucleation layer that renders these surfaces catalytic to electroless copper.

Thereafter, the structure is removed from the copper activator solution and submerged in an electroless copper plating solution such as Shipley CUPOSIT™ 250 at 60° C. and the first copper layer deposits on metal bases 130 and 140, conductive traces 180 and 190, drill hole indexes 186 and encapsulant base 222 within through-holes 224, thereby assuring that all sidewall portions of through-holes 224. are covered with plated metal, and on metal bases 130 and 140, finger portions 184 and 194 and drill hole indexes 186 outside through-holes 224.

Thereafter, the structure is removed from the electroless copper plating solution, metal base 130 is connected to a plating bus (not shown), current is applied to the plating bus from an external power source, and the structure is submerged in an electrolytic copper plating solution such as Sel-Rex CUBATH M™ at room temperature while current is applied to the plating bus to electroplate the second copper layer on the first copper layer. Thereafter, the structure is removed from the electrolytic copper plating solution and rinsed in distilled water to remove contaminants.

Figure 1Q:
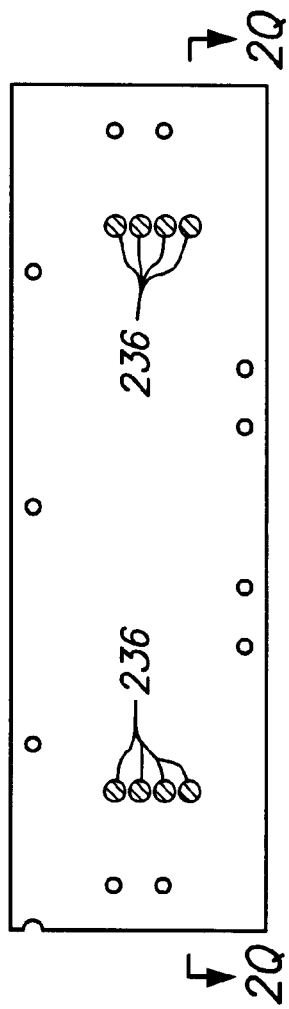
Figure 2Q:
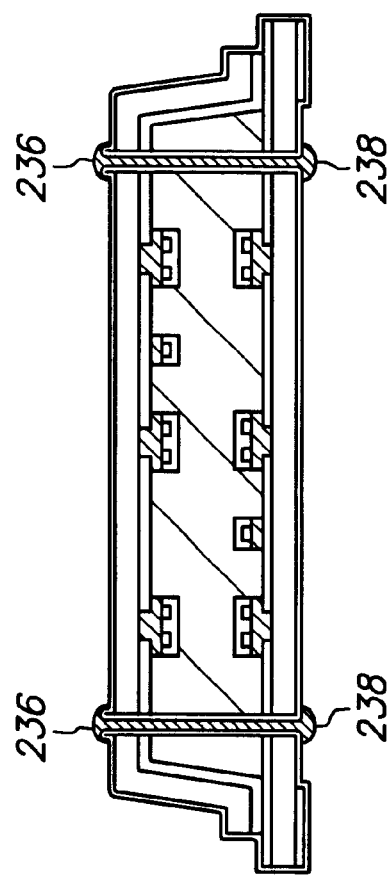
Figure 3Q:
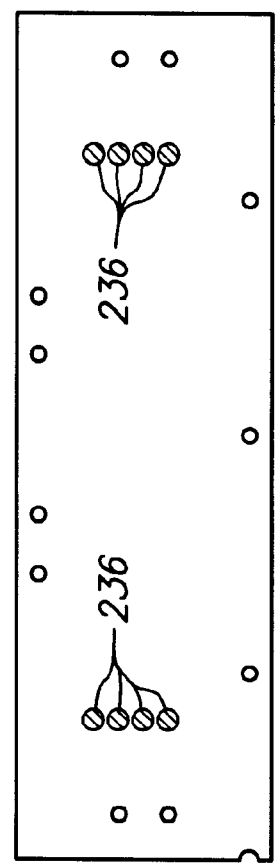

FIGS. 1Q, 2Q and 3Q are top, cross-sectional and bottom views, respectively, of plugs 236 filled in the remaining space in through-holes 224. Plugs 236 includes domes 238 that extend outside through-holes 224 and have a substantially larger diameter than through-holes 224. Plugs 236 are initially an epoxy paste that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is deposited into through-holes 224 and onto electrical interconnects 230 using stencil printing. During the stencil printing process, a stencil (not shown) is placed on the structure, stencil openings are aligned with through-holes 224, and then a squeegee (not shown) pushes the epoxy paste along the surface of the stencil opposite the structure, through the stencil openings and into through-holes 224. The stencil printing process is applied from both sides of the structure to form domes 238 on opposite sides of through-holes 224 with the desired shapes and dimensions. The epoxy paste is compliant enough at room temperature to conform to virtually any shape. Thus, the epoxy paste fills and plugs through-holes 224. Thereafter, the epoxy paste is cured or hardened at relatively low temperature in the range of 100–250° C. to form plugs 236 as solid adherent insulative features.

FIGS. 1R, 2R and 3R are top, cross-sectional and bottom views, respectively, of the structure after metal bases 130 and 140 and metal layers 232 and 234 are subjected to wet chemical etching. The structure is dipped in the wet chemical etch and etching occurs simultaneously from both sides. A suitable wet chemical etch can be provided by the same solution used to form outer edges 152 and 162, alignment holes 154 and 164, fiducial indexes 156 and 166 and tooling holes 168 in metal bases 130 and 140. The wet chemical etch is highly selective of copper with respect to nickel, epoxy and the molding compound. Therefore, the wet chemical etch is highly selective of metal bases 130 and 140 and metal layers 232 and 234, but has little or no effect on the nickel layers of conductive traces 180 and 190, the nickel layers of finger portions 184 and 194, adhesives 200 and 202, encapsulant base 222 and plugs 236.

The wet chemical etch is initially applied to metal layers 232 and 234. As a result, the portions of metal layers 232 and 234 outside domes 238 are completely removed, and the portions of metal layers 232 and 234 adjacent to the outer peripheries of domes 238 are removed by undercutting. However, since domes 238 provide etch masks, portions of metal layers 232 and 234 within the peripheries of domes 238 remain intact.

Thereafter, the wet chemical etch reaches metal bases 130 and 140 and finger portions 184 and 194, which were previously covered by metal layers 232 and 234. As a result, the portions of metal bases 130 and 140 outside finger portions 184 and 194 and domes 238 are completely removed, and the portions of metal bases 130 and 140 adjacent to the outer peripheries of finger portions 184 and 194 and domes 238 are removed by undercutting. However, since the second nickel layers of finger portions 184 and 194 provide etch masks, and domes 238 continue to provide etch masks, portions of metal bases 130 and 140 within the peripheries finger portions 184 and 194, and portions of metal bases 130 and 140 and metal layers 232 and 234 within the peripheries of domes 238 remain intact. Similarly, the copper layers (between the first and second nickel layers) of finger portions 184 and 194 are subject to undercutting at the outer peripheries but remain largely intact due to their large surface areas.

Thereafter, the wet chemical etch reaches conductive traces 180 and 190, adhesives 200 and 202, and encapsulant base 222, which were previously covered by metal bases 130 and 140. However, since the first nickel layers of conductive traces 180 and 190 (that were electroplated onto metal bases 130 and 140, respectively), adhesives 200 and 202 and encapsulant base 222 provide etch masks, and the second nickel layers of finger portions 184 and 194 and domes 238 continue to provide etch masks, portions of metal bases 130 and 140 within the peripheries of finger portions 184 and 194, and portions of metal bases 130 and 140 and metal layers 232 and 234 within the peripheries of domes 238 remain intact. Similarly, the copper layers (between the first and second nickel layers) of finger portions 184 and 194 are subject to undercutting at the outer peripheries but remain largely intact. Moreover, encapsulant base 222 and the first nickel layers of conductive traces 180 and 190 prevent the wet chemical etch from reaching the copper layers (between the first and second nickel layers) of conductive traces 180 and 190, and encapsulant base 222 and domes 238 prevent the wet chemical etch from reaching electrical interconnects 230. Nonetheless, it is preferable that rapid endpoint detection and removal from the wet chemical etch occur to prevent excessive undercutting of the exposed copper layers.

Therefore, no appreciable amount of chips 110 and 120, conductive traces 180 and 190, finger portions 184 and 194, adhesives 200 and 202, encapsulant base 222 and electrical interconnects 230 is removed. The optimal etch time for exposing the structure to the wet chemical etch in order to selectively remove the desired portions of metal bases 130 and 140 and metal layers 232 and 234 without excessively undercutting the copper features exposed to the wet chemical etch that are intended to remain largely intact can be established through trial and error.

Finger portions 182 and 184 and the unetched portions of metal base 130 sandwiched therebetween form fingers 240, and finger portions 192 and 194 and the unetched portions of metal base 140 sandwiched therebetween form fingers 242. Accordingly, fingers 240 are connected to conductive traces 180 in one-to-one relation, and fingers 242 are connected to conductive traces 190 in one-to-one relation.

Advantageously, encapsulant base 222 provides mechanical support for conductive traces 180 and 190, and therefore reduces the mechanical strain on adhesives 200 and 202. The enhanced mechanical strength is particularly useful after metal bases 130 and 140 are etched and almost entirely removed. Furthermore, encapsulant base 222 protects the copper layers of conductive traces 180 and 190 from the wet chemical etch. Accordingly, encapsulant base 222 improves the structural integrity and allows the wet chemical etch and any subsequent cleaning steps to be applied more vigorously, thereby improving manufacturing throughput.

At this stage, chips 110 and 120 remain embedded in adhesives 200 and 202 and encapsulant base 222, and conductive traces 180 and 190 overlap and remain electrically isolated from pads 216 and 226.

Figure 1S:
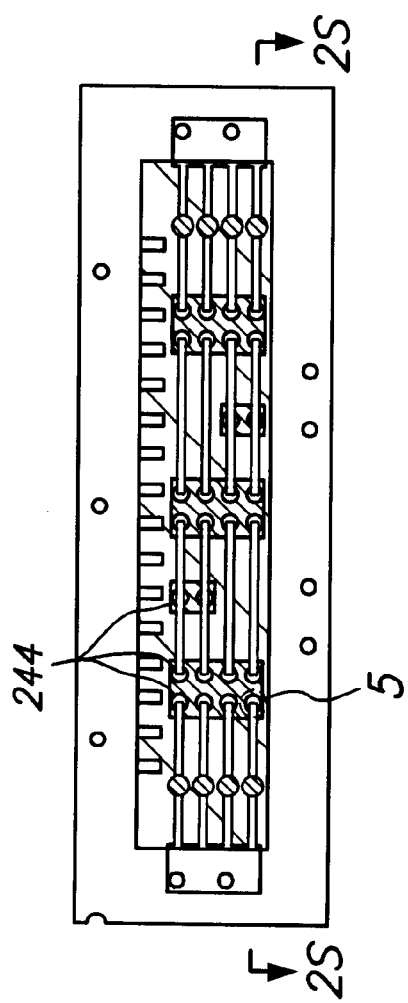
Figure 2S:
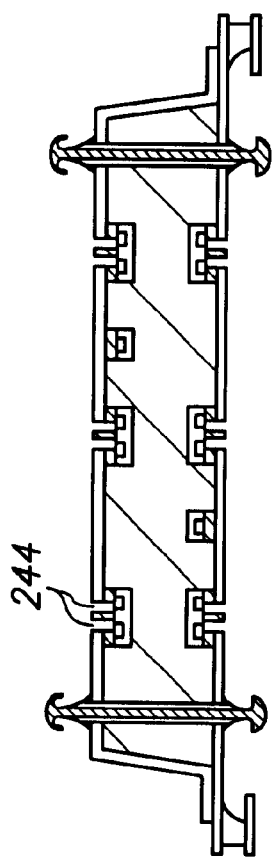
Figure 3S:
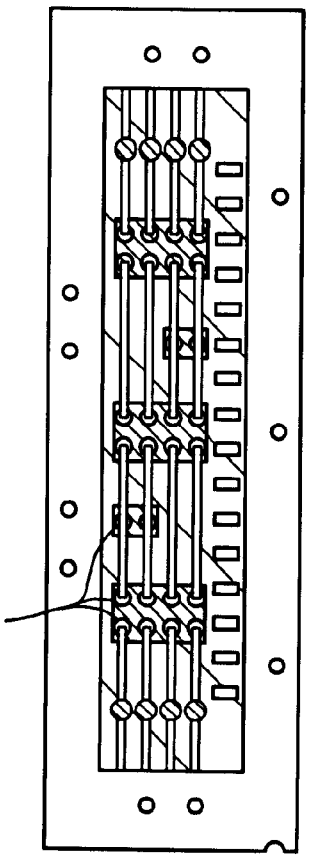

FIGS. 1S, 2S and 3S are top, cross-sectional and bottom views, respectively, of the structure after portions of adhesives 200 and 202 are selectively removed to form openings 244 in adhesives 200 and 202 that expose pads 116 and 126 and conductive traces 180 and 190. Openings 244 are formed by applying a suitable etch that is highly selective of adhesives 200 and 202 with respect to pads 116 and 126 and conductive traces 180 and 190.

In this instance, a selective laser etch is applied. Using projection laser ablation, metal masks (not shown) are positioned relative to adhesives 200 and 202 such that openings in the metal masks are aligned with pads 116 and 216, and a laser is directed to the sides of the metal masks opposite adhesives 200 and 202. Accordingly, the metal masks target the laser at pads 116 and 126. The laser removes portions of adhesives 200 and 202 above pads 116 and 126 and outside conductive traces 180 and 190. Openings 244 have a diameter of 100 microns, and pads 116 and 126 (with a length and width of 70 microns) are exposed by but axially offset from openings 244. Conductive traces 180 and 190 shield the underlying adhesives 200 and 202, respectively from the laser etch so that the portions of adhesives 200 and 202 sandwiched between conductive traces 180 and 190 and pads 116 and 126 remain intact. Openings 244 are formed in adhesives 200 and 202 without damaging pads 116 and 126, passivation layers 118 and 128 and conductive traces 180 and 190. Thus, openings 244 extend through adhesives 200 and 202, but do not extend into chips 110 and 120.

FIG. 5 is an enlarged plan view of encircled detail 5 in FIG. 1S, and FIGS. 6 and 7 are enlarged cross-sectional views taken across lines 6—6 and 7—7, respectively, in FIG. 5, that depict a representative pad 116, conductive trace 180 and opening 244 in greater detail.

Figure 1T:
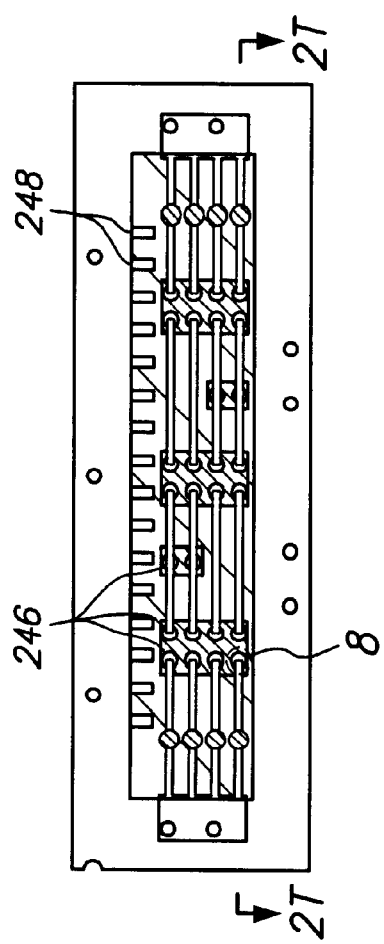
Figure 2T:
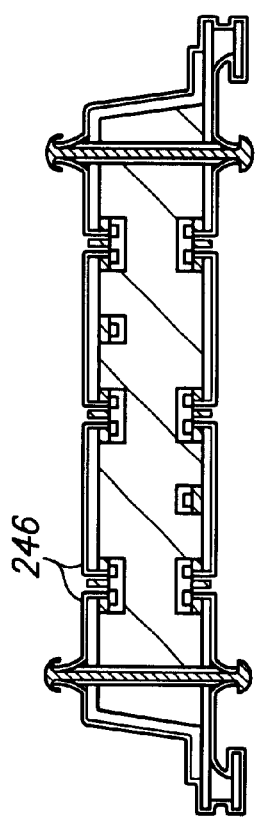
Figure 3T:
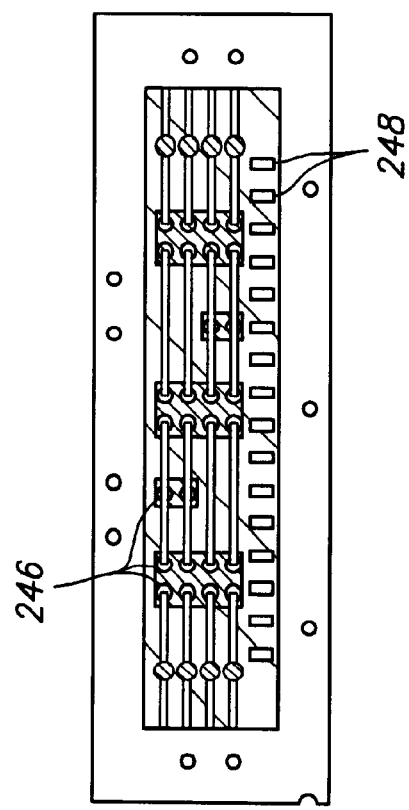

FIGS. 1T, 2T and 3T are top, cross-sectional and bottom views, respectively, of connection joints 246 formed on pads 116 and 126 and conductive traces 180 and 190, and contact terminals 248 formed as surface layers for fingers 240 and 242, by electroless plating.

Connection joints 246 are composed of a nickel layer electrolessly plated onto pads 116 and 126 and conductive traces 180 and 190, and a gold layer electrolessly plated onto the nickel layer. Similarly, contact terminals 248 are composed of a nickel layer electrolessly plated onto fingers 240 and 242, and a gold layer electrolessly plated onto the nickel layer. Thus, the nickel layer is sandwiched between and contacts the underlying metal and the gold layer, and the gold layer contacts the nickel layer and is exposed.

In order to initiate electroless deposition of connection joints 246 and contact terminals 248, the structure is dipped in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a by product of the nickel, reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pads 116 and 126, conductive traces 180 and 190 and fingers 240 and 242 include nickel surface layers which are catalytic to electroless nickel. Therefore, a nickel activator solution need not be applied. The electroless nickel is amorphous and does not deposit on passivation layers 118 and 128, adhesives 200 and 202, encapsulant base 222 and plugs 236, and therefore a mask is not necessary.

Connection joints 246 initially include first portions that begin to plate on pads 116 and 126 and second portions that begin to plate on conductive traces 180 and 190, although the first and second connection joint portions do not contact one another and pads 116 and 126 remain electrically isolated from conductive traces 180 and 190. In addition, contact terminals 248 begin to plate on fingers 240 and 242.

As the electroless nickel plating operation continues, and the separate connection joint portions continue to plate on pads 116and 126 and conductive traces 180 and 190, the connection joint portions eventually contact one another and metallurgically merge into unitary continuous nickel joints that electrically connect pads 116 and 126 to conductive traces 180 and 190. At this point, connection joints 246 and contact terminals 248 are primarily nickel, contain about 4 to 9 weight percentage phosphorus and are 15 microns thick.

Thereafter, the assembly is removed from the electroless nickel plating solution and briefly submerged in an electroless gold plating solution such as is MacDermid PLANAR™ at 70° C. The electrolessly plated nickel is catalytic to electrolessly plated gold. Advantageously, the gold electrolessly deposits on the nickel without depositing on passivation layers 118 and 128, adhesives 200 and 202, encapsulant base 222 and plugs 236, and therefore a mask is not necessary. Thereafter, the assembly is removed from the electroless gold plating solution and rinsed in distilled water.

The gold surface layer is relatively thin, with a thickness on the order of 0.5 microns. Thus, connection joints 246 and contact terminals 248 consist of a 15 micron thick buried nickel layer covered by a 0.5 micron thick gold surface layer. For convenience of illustration, the buried nickel layer and the gold surface layer are shown as a single layer. The buried nickel layer provides the primary electrical connection for connection joints 246, and the gold surface layer prevents the nickel layer from oxidizing so that contact terminals 248 can make good electrical contact with the next level assembly but is of relatively little importance to connection joints 246.

Connection joints 246 are formed in openings 244 and contact and electrically connect pads 116 and 126 with conductive traces 180 and 190. Connection joints 246 contact and cover portions of pads 116 and 126 beneath openings 244 and outside conductive traces 180 and 190, the surfaces of conductive traces 180 and 190 that overlap and face away from pads 116 and 126, and the outer edges (or peripheral sidewalls) of conductive traces 180 and 190 that overlap and are orthogonal to pads 116 and 126. Thus, connection joints 246 provide robust, permanent electrical connections between pads 116 and conductive traces 180, between pads 116 and conductive traces 190, between pads 126 and conductive traces 180, and between pads 126 and conductive traces 190.

Connection joints 246 are the only electrical conductors external to chips 110 and 120 that contacts pads 116 and 126, adhesives 200 and 202 and connection joints 246 are the only materials external to chips 110 and 120 that contact pads 116 and 126, and adhesives 200 and 202 and connection joints 246 are the only materials that contact both pads 116 and 126 and conductive traces 180 and 190.

Figure 10:
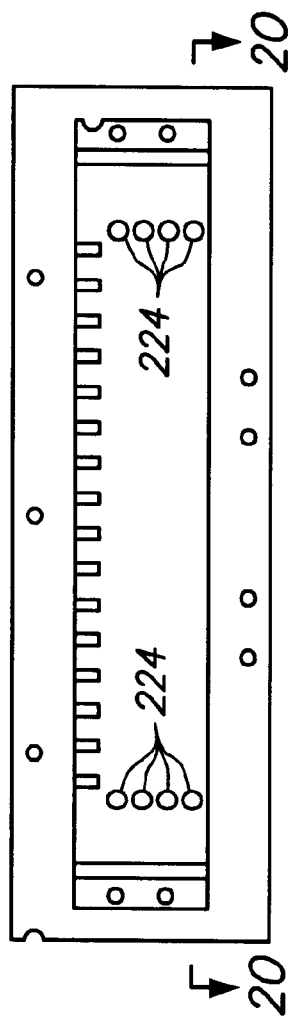
FIGS. 9 and 10 are enlarged cross-sectional views taken along lines 9—9 and 10—10, respectively, in FIG. 8.
Figure 20:
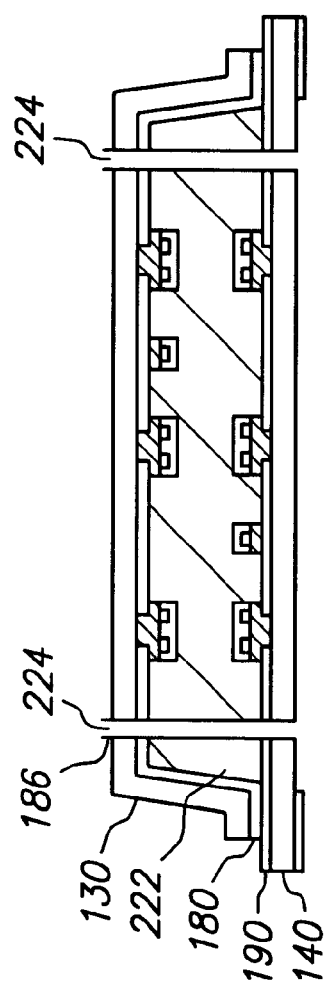
Figure 30:
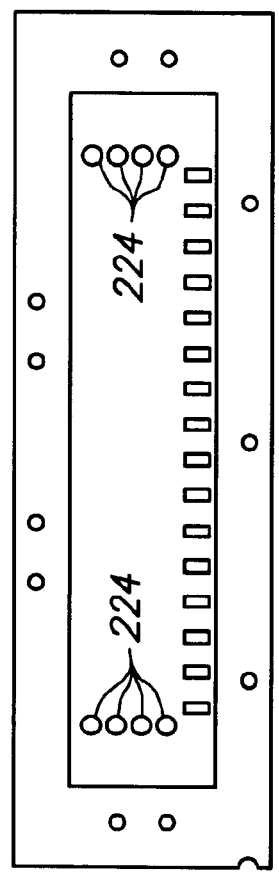
Figure 9:
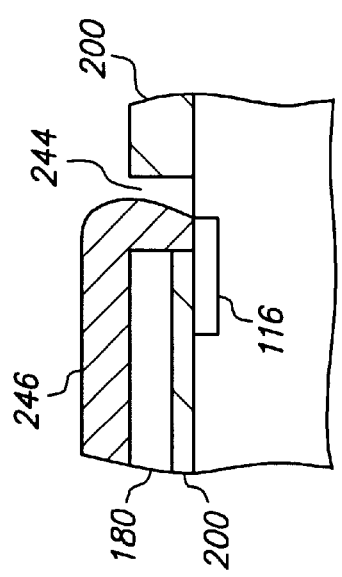
Figure 8:
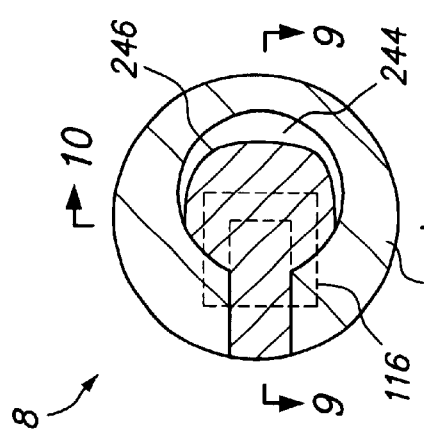
FIG. 8 is an enlarged plan view of encircled detail 8 in FIG. 1T.

FIG. 8 is an enlarged plan view of encircled detail 8 in FIG. 1T, and FIGS. 9 and 10 are enlarged cross-sectional views taken across lines 9—9 and 10—10, respectively, in FIG. 8, that depict a representative pad 116, conductive trace 180, opening 244 and connection joint 246 in greater detail.

Figure 1U:
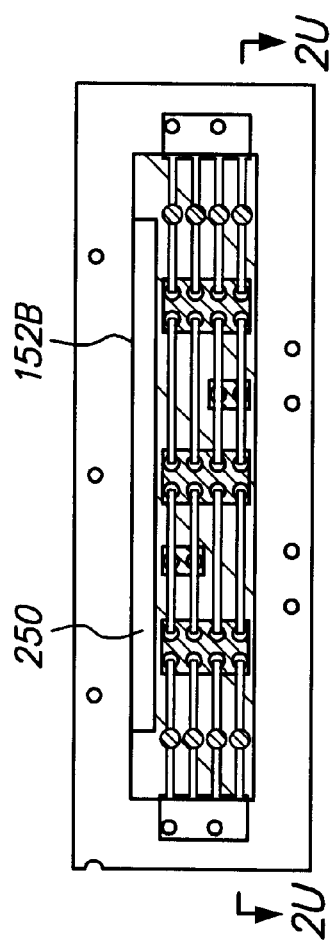
Figure 2U:
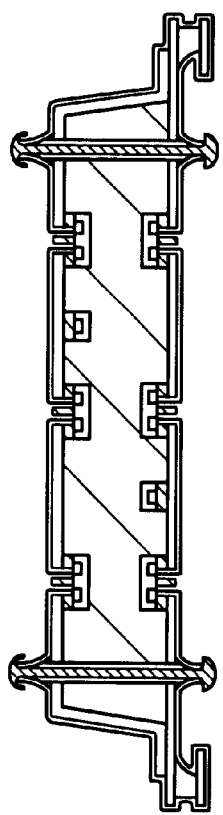
Figure 3U:
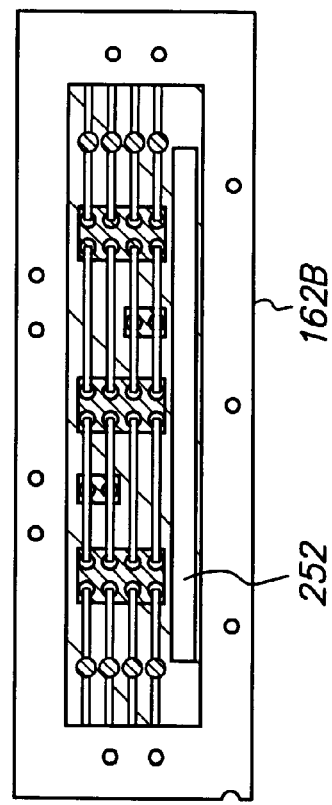

FIGS. 1U, 2U and 3U are top, cross-sectional and bottom views, respectively, of tapes 250 and 252 disposed on fingers 240 and 242, respectively. Tapes 250 and 252 are laminated on fingers 240 and 242, respectively, and since they are sticky, they adhere to fingers 240 and 242, respectively. Tapes 250 and 252 have a length (parallel to outer edges 152B and 162B) of 5 mm, a width (perpendicular to outer edges 152B and 162B) of 150 microns, a thickness of 100 microns and are composed of polyimide.

Figure 1V:
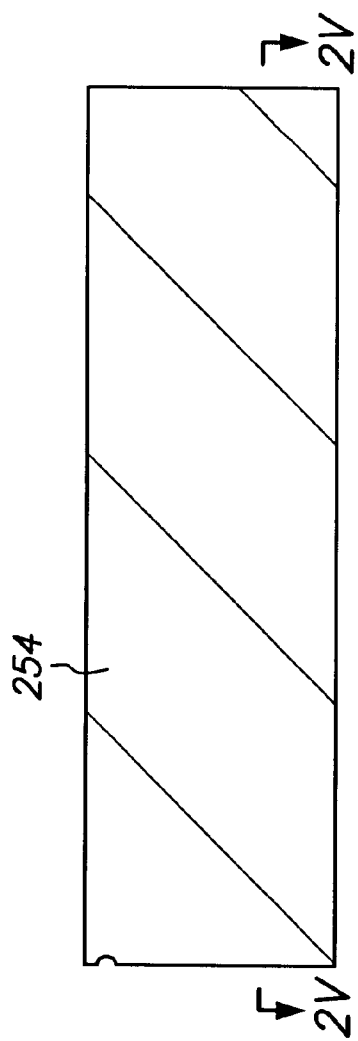
Figure 2V:
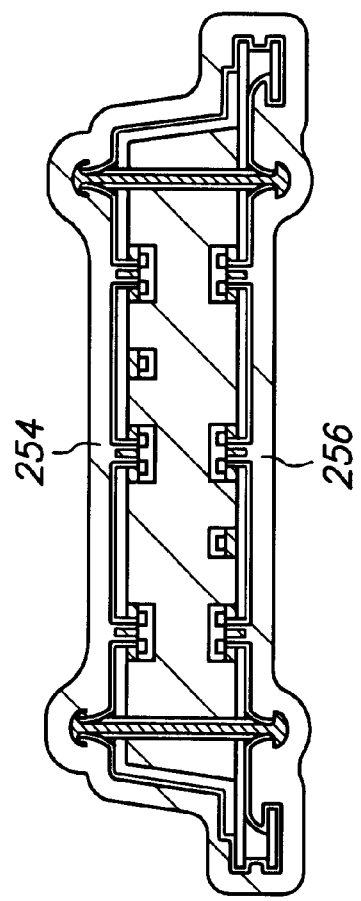
Figure 3V:
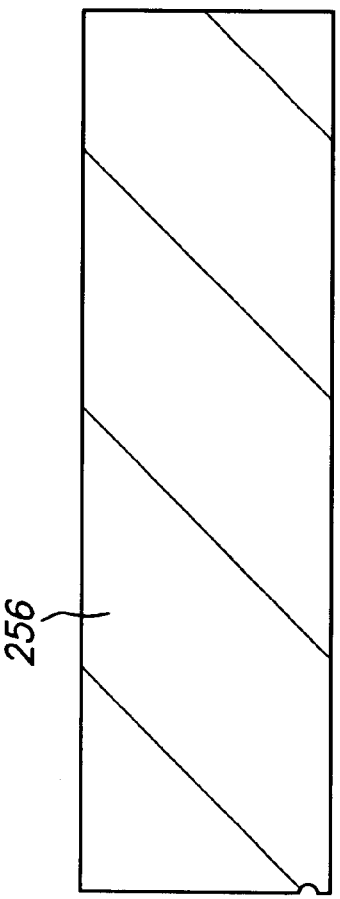

FIGS. 1V, 2V and 3V are top, cross-sectional and bottom views, respectively, of insulative bases 254 and 256 disposed on the structure. Insulative base 254 is disposed on the side that includes tape 250, and insulative base 256 is disposed on the side that includes tape 252. Insulative bases 254 and 256 are deposited as a liquid resin (A stage) epoxy by dipping the structure in a liquid resin pool. Thereafter, the liquid resin is fully cured or hardened at a relatively low temperature in the range of 100–250° C. to form insulative bases 254 and 256 as solid adherent epoxy layers (C stage) with a thickness over tapes 250 and 252, respectively, of 30 microns. Tapes 250 and 252 prevent insulative bases 254 and 256, respectively, from contacting fingers 240 and 242, respectively, and from entering the gaps between fingers 240 and 242, respectively.

FIGS. 1W, 2W and 3W are top, cross-sectional and bottom views, respectively, of the structure after tapes 250 and 252 are stripped. Tapes 250 and 252 are removed by being peeled off since they adhere relatively weakly to the structure and do not contain isolated segments, and the peeling off process is more economical and convenient than applying a selective etch. The peeling off process also removes the overlaying portions of insulative bases 254 and 256, respectively. Thereafter, a brief oxygen plasma cleaning step is applied to remove any tape residue on fingers 240 and 242 without removing an appreciable amount of insulative bases 254 and 256. Therefore, fingers 240 and 242 become exposed and available for connection to the next level assembly.

Figure 1X:
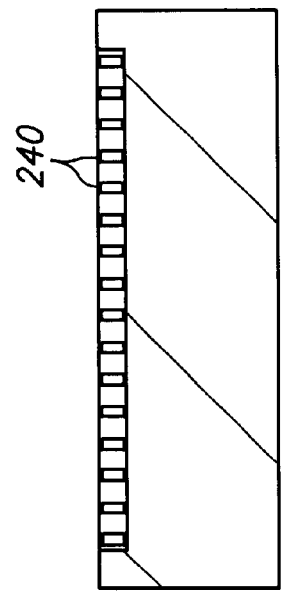
Figure 2X:
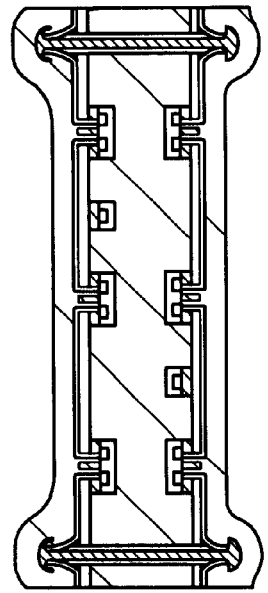
Figure 3X:
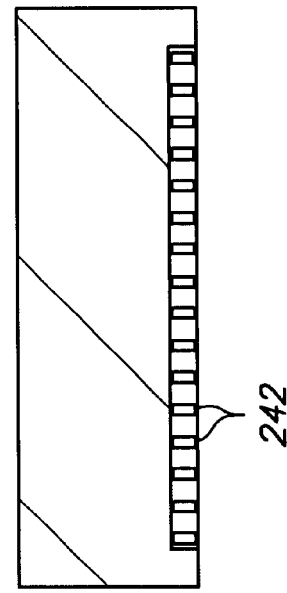

FIGS. 1X, 2X and 3X are top, cross-sectional and bottom views, respectively, of the structure after a trimming operation is applied to remove the peripheral portions of the structure. In particular, mechanical sawing is applied to opposing sides of the structure along the length of the structure such that new outer edges that extend lengthwise (parallel to outer edges 152B, 152D, 162B and 162D) are aligned with outer edges 152B and 152D. As a result, fingers 240 and 242 are aligned with a new lengthwise outer edge and can be readily inserted into an edge-type connector. In addition, mechanical sawing is applied to opposing sides of the structure along the width of the structure between legs 210 and electrical interconnects 230, thereby removing plating regions 188, legs 210, attachment joints 220, and portions of encapsulant base 222, such that new outer edges that extend widthwise (parallel to outer edges 152A, 152C, 162A and 162C) are spaced from electrical interconnects 230. As a result, conductive traces 180 with capture pads 180B are singulated from one another, and conductive traces 190 with capture pads 190B are singulated from one another. Furthermore, encapsulant base 222 becomes exposed at four outer edges of the structure rather than two.

At this stage, the manufacture of semiconductor module 260 that includes chips 110 and 120, conductive traces 180 and 190, drill hole indexes 186, adhesives 200 and 202, encapsulant base 222, electrical interconnects 230, fingers 240 and 242, connection joints 246, and insulative bases 254 and 256 can be considered complete. Conductive traces 180 and 190 are mechanically coupled to chips 110 and 120 by adhesives 200 and 202, respectively, and are electrically coupled to chips 110 and 120 by connection joints 246. Selected conductive traces 180 and 190 are electrically coupled to one another by electrical interconnects 230. Conductive traces 180 and 190 extend to and are electrically coupled to fingers 240 and 242, respectively, which are designed to mate with a printed circuit board. Thus, conductive traces 180 and 190 extend within and outside the peripheries of chips 110 and 120 and provide horizontal fan-out routing for pads 116 and 126, electrical interconnects 230 provide vertical routing between selected conductive traces 180 and 190, and fingers 240 and 242 include contact terminals 248 for connection to external circuitry. Encapsulant base 222 and insulative bases 254 and 256 provide mechanical support and environmental protection for the structure. Furthermore, chips 110 and 120 and conductive traces 180 and 190 are embedded in encapsulant base 222, which is the support carrier for the module.

The semiconductor module described above is merely exemplary. Numerous other embodiments are contemplated.

The conductive traces can have various shapes and sizes. The conductive trace can overlap various portions of the pads, such as one peripheral edge and the center of the pad (FIG. 5), two opposing peripheral edges and the center of the pad, three peripheral edges but not the center of the pad, two corners and the center of the pad, or four peripheral edges but not the center of the pad.

The conductive traces can be various conductive metals including copper, gold, nickel, aluminum, palladium, tin, combinations thereof, and alloys thereof. The preferred composition of the conductive traces will depend on the nature of the connection joints as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive traces may function as a signal, power or ground layer depending on the purpose of the associated chip pads. Likewise, the conductive traces can fan-in and fan-out, regardless of whether they include or are connected to the fingers.

The metal bases can be various metals such as copper, gold, nickel, aluminum, palladium, tin, combinations thereof, and alloys and need not necessarily have the same composition.

The metal bases and the conductive traces can each be a single layer or multiple layers. If desired, the conductive traces can be spot plated near the pads to make them compatible with receiving the connection joints. For instance, a copper trace can be spot plated with nickel and then silver to make it compatible with a gold ball bond connection joint and avoid the formation of brittle silver-copper intermetallic compounds. As another example, the conductive traces layer can include a non-copper layer between a copper layer and the insulative base. Suitable non-copper layers include nickel, gold, palladium and silver. A gold layer is well-suited for receiving a gold ball bond connection joint.

The metal bases can be etched in numerous manners. For instance, portions of the metal bases above the pads can be selectively etched to permit formation of the openings in the adhesives, and other portions of the metal bases can remain intact and connected to the conductive traces. Alternatively, portions of the metal bases above the pads can be selectively etched to permit formation of the openings, and other portions of the metal bases that are isolated from the conductive traces and disposed within the peripheries of the chips can remain intact and provide heat sinks.

The insulative bases may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative bases can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in the epoxy resin. Fibers that may be used include aramid, polyester, polyamide, poly-ether-ether-ketone, polyimide, polyetherimide and polysulfone. The fiber reinforcement can be woven fabric, non-woven fabric or paper. Commercially available dielectric materials such as SPEEDBOARD C prepreg by W. L. Gore & Associates of Eau Claire, Wis. are suitable.

The attachment joints can be formed in numerous manners. For instance, the attachment joints can be formed by welding, brazing or soldering the metal bases together.

Furthermore, the legs can be omitted, and vertical spacers can be adhesively disposed between opposing peripheral ends of the metal bases.

The through-holes can be formed in numerous manners. For instance, the through-holes can be formed with a single removal step such as mechanical drilling, mechanical punching or laser drilling. Alternatively, the through-holes can be formed with multiple removal steps. For example, masking films can be deposited on the metal bases, the through-holes can be formed through the metal bases and the conductive traces using wet chemical etching, and then through the encapsulant base using laser drilling or plasma etching.

The pads can have numerous shapes including a flat rectangular shape and a bumped shape. For instance, a bump-shaped pad may extend into the opening and may even extend above the conductive trace. The pads can either be partially or completely exposed prior to forming the connection joints. The pads can have a length and width that are larger than, equal to, or smaller than the diameter of the openings. Preferably, the pads and openings have the same or similar size, and a substantial portion of the pads is directly beneath the openings.

Numerous adhesives can be applied between the chips and the conductive traces. For instance, the adhesives can be applied as a paste, a laminated layer, or a liquid applied by screen-printing, spin-on, or spray-on. If paste or liquid adhesives are applied, the adhesives may contact the metal bases, whereas if laminated adhesives are applied then no appreciable amount of adhesive may contact the metal bases. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable.

The openings can be formed in the adhesives either before or after mechanically attaching the chips to the conductive traces. For instance, the adhesives can be applied as a liquid or paste (A stage) to the bottom surface of the conductive traces, the adhesives can be partially cured (B stage), a back-side etch can form the openings in the adhesives, the partially cured adhesives can be brought into contact with the chips, and then the adhesives can be fully cured (C stage).

Alternatively, the liquid or paste adhesives can be sandwiched between the chips and the conductive traces, the adhesives can be fully cured thereby mechanically fastening the chips to the conductive traces, and then a front-side etch can form the openings in the adhesives.

The openings can be formed with numerous etching techniques. For instance, the openings can be formed by laser direct write (without a mask). In addition, the openings can have a circular, ovular, square, rectangular or other shape. The openings may be aligned with and expose single pads or a plurality of pads. Furthermore, the openings can have sidewalls with a wide variety of shapes and slopes including vertical sidewalls, tapered sidewalls, continuous sidewalls and stepped sidewalls.

The encapsulant base can be filled into the chamber using a wide variety of techniques including printing and transfer molding. For instance, the encapsulant base can be an epoxy paste that is deposited into the chamber and then cured or hardened. The encapsulant base can be any of the adhesives mentioned above. Moreover, the encapsulant base need not necessarily contact the chips. For instance, glob-top coatings can be deposited on the chips after mechanically attaching the chips to the conductive traces and before attaching the assemblies, and then the encapsulant base can be formed on the glob-top coatings after attaching the assemblies.

The electrical interconnects can be formed from a wide variety of materials and processes. For instance, the electrical interconnects can be formed by depositing solder paste into the through-holes and then reflowing the solder paste to form solder joints. Alternatively, the electrical interconnects can be formed by depositing a conductive adhesive into the through-holes and then curing the conductive adhesive.

The connection joints can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on the composition of the conductive traces as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint " which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint " which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint " which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint " which is incorporated by reference.

The conductive traces can be formed and attached to the chips by a wide variety of lead-on-chip (LOC) and other connection techniques. See, for instance, U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment, " and U.S. application Ser. No. 09/878,626 filed Jun. 11, 2001 by Charles W. C. Lin entitled "Method of Connecting a Conductive Trace to a Semiconductor Chip, " each of which is incorporated by reference. Conventional wire bonding, TAB and flip-chip techniques can also be employed. With conventional wire bonding, TAB and flip-chip techniques, the connection joints between the conductive traces and the pads can be formed before the encapsulant base and electrical interconnects are formed.

A soldering material or solder balls can be deposited on the fingers by plating or printing or placement techniques if required for the next level assembly. Moreover, the fingers can be formed with a solder surface layer, thereby rendering additional soldering material unnecessary. However, the next level assembly may not require that the module contain solder. For instance, in land grid array (LGA) packages, the soldering material is normally provided by the panel rather than the package. Likewise, the fingers can be adapted for insertion into a socket without solder connections.

The "upper " and "lower " surfaces of the chips and the "top " and "bottom " surfaces of the conductive traces and other features do not depend on the orientation of the structure, as will be readily apparent to those skilled in the art. For instance, the upper surface of a chip includes the pads, regardless of whether the chip is inverted, and regardless of whether the structure is inverted and/or mounted on a printed circuit board. Similarly, a conductive trace disposed in an opening "above" a chip includes a bottom surface that faces the upper surface of the chip, regardless of whether the chip is inverted. Likewise, the structure is shown with a single orientation throughout the drawings (except assembly 204 is inverted by being flipped lengthwise before being positioned over assembly 206 in FIGS. 1L, 2L and 3L) for ease of comparison between the figures, although the structure and its components may be inverted at various manufacturing stages.

The semiconductor module of the present invention can include a wide variety of chips including microprocessors, field programmable gate arrays (FPGAs), logic drivers, and memories such as dynamic random access memories (DRAMs) and static random access memories (SRAMs). The chips can have identical functionality, such as stacked memory chips, or different functionality, such as a microprocessor and a memory chip. The chips need not have identical sizes or be vertically aligned with one another. For instance, multiple memory chips may have identical surface areas but different thickness due to variations introduced by wafer processing, in which case the encapsulant base easily conforms to accommodate these thickness variations. Furthermore, the chips may have different surface areas, as may be the case with a microprocessor and a memory chip, in which case the electrical interconnects would still be outside the peripheries of the chips but the conductive traces would have varying lengths to accommodate the varying horizontal distances between the electrical interconnects and the chip pads. Similarly, the assemblies may contain any combination of active and passive components.

The semiconductor module of the present invention is particularly well-suited to provide a dual in-line memory module (DIMM). A single in-line memory module (SIMM) is a multichip module having multiples of the same memory chip aligned in a row, and the terminals are adapted for attachment to an edge-type connector on a printed circuit board. In this manner, the memory chips are connected to a printed circuit board to provide a single device with the memory capacity of the combined memory chips. As demand for additional memory on a single device has increased, other devices such as DIMMs have been developed. A DIMM resembles two stacked SIMMs with two rows of memory chips. For instance, the Samsung PC133 registered DIMM includes a printed circuit board with rows of memory chips mounted on opposing major surfaces. The semiconductor module of the present invention can be configured as a DIMM in which two rows of memory chips are embedded in opposite sides of the encapsulant base, the encapsulant base provides the support carrier, and the fingers are adapted to plug into a motherboard.

Advantageously, the semiconductor module of the present invention is reliable and inexpensive. The encapsulant base and insulative bases protect the chips from handling damage and provide a known dielectric barrier for the conductive traces. The encapsulant base also provides critical mechanical support for the conductive traces after the metal bases are etched. The mode of the connection between the chips and the conductive traces shifts from the initial mechanical coupling to metallurgical coupling to assure sufficient metallurgical bond strength. Furthermore, the conductive traces can be mechanically and metallurgically coupled to the chips without wire bonding, TAB or solder joints, although the process is flexible enough to accommodate these techniques if desired. The module can have a TSOP, BGA or other packaging format as required by the next level assembly. As a result, the module significantly enhances throughput, yield and performance characteristics compared to conventional packaging techniques. Moreover, the module is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of making a semiconductor module, comprising:

providing a first semiconductor chip assembly that includes a first semiconductor chip and a first carrier, wherein the first chip includes a first conductive pad and the first carrier includes a first conductive trace;

providing a second semiconductor chip assembly that includes a second semiconductor chip and a second carrier, wherein the second chip includes a second conductive pad and the second carrier includes a second conductive trace;

forming an encapsulant base between and in contact with the first and second assemblies;

forming a through-hole that extends through the carriers and the encapsulant base and is located outside the peripheries of the first and second chips;

forming an electrical interconnect in the through-hole that contacts the first and second traces in the through-hole; and forming first and second connection joints, wherein the first connection joint contacts and electrically connects the first trace and the first pad, and the second connection joint contacts and electrically connects the second trace and the second pad.

2. The method of claim 1, wherein forming the encapsulant base includes contacting the encapsulant base to the first and second chips and the first and second traces.

3. The method of claim 1, wherein forming the encapsulant base includes transfer molding the encapsulant base.

4. The method of claim 1, wherein forming the through-hole includes mechanically drilling the through-hole through the carriers and the encapsulant base.

5. The method of claim 1, wherein forming the electrical interconnect includes electrolessly plating a metal on sidewalls of the through-hole.

6. The method of claim 1, including forming the connection joints after forming the electrical interconnect.

7. The method of claim 1, including forming an attachment joint that mechanically attaches the first and second carriers to one another before forming the encapsulant base.

8. The method of claim 7, including removing the attachment joint after forming the encapsulant base.

9. The method of claim 1, including performing the steps after providing the assemblies in the sequence set forth.

10. The method of claim 1, wherein the module is devoid of wire bonds, TAB leads and solder joints.

11. A method of making a semiconductor module, comprising:

providing a first semiconductor chip assembly that includes a first semiconductor chip and a first carrier, wherein the first chip includes a first conductive pad and the first carrier includes a first conductive trace;

providing a second semiconductor chip assembly that includes a second semiconductor chip and a second carrier, wherein the second chip includes a second conductive pad and the second carrier includes a second conductive trace;

forming an attachment joint that mechanically attaches the first and second carriers;

forming an encapsulant base between and in contact with the first and second assemblies after forming the attachment joint;

forming a through-hole that. extends through the carriers and the encapsulant base and is located outside the peripheries of the first and second chips;

forming an electrical interconnect in the through-hole that contacts the first and second traces in the through hole;

forming first and second connection joints, wherein the first connection joint contacts and electrically connects the first trace and the first pad, and the second connection joint contacts and electrically connects the second trace and the second pad; and removing the attachment joint.

12. The method of claim 11, wherein forming the attachment joint includes welding the first and second carriers to one another.

13. The method of claim 11, wherein forming the encapsulant base includes contacting the encapsulant base to the first and second chips and the first and second traces.

14. The method of claim 11, wherein forming the encapsulant base includes transfer molding the encapsulant base.

15. The method of claim 11, wherein forming the through-hole includes mechanically drilling the through-hole through the carriers and the encapsulant base.

16. The method of claim 11, wherein forming the electrical interconnect includes electrolessly plating a metal on sidewalls of the through-hole.

17. The method of claim 11, including forming the connection joints after forming the electrical interconnect.

18. The method of claim 11, including bending the first carrier to form a pair of legs that extend across a thickness of the first chip, and then forming the attachment joint between the legs and the second carrier.

19. The method of claim 11, including performing the steps after providing the assemblies in the sequence set forth.

20. The method of claim 11, wherein the module is devoid of wire bonds, TAB leads and solder joints.

21. A method of making a semiconductor module, comprising the following steps in the sequence set forth:

providing first and second semiconductor chip assemblies, wherein the first assembly includes a first semiconductor chip and a first carrier, the first chip includes a first top surface and a first bottom surface, the first top surface includes a first conductive pad, the first carrier includes a first metal base and a first conductive trace, the first top surface faces towards the first metal base, the second assembly includes a second semiconductor chip and a second carrier, the second chip includes a second top surface and a second bottom surface, the second top surface includes a second conductive pad, the second carrier includes a second metal base and a second conductive trace, and the second top surface faces towards the second metal base;

forming an attachment joint that mechanically attaches the first and second carriers, wherein the first and second traces are exposed and face towards one another, and the first and second bottom surfaces are exposed and face towards one another;

forming an encapsulant base between and in contact with the first and second traces and the first and second bottom surfaces;

forming a through-hole that extends through the first and second metal bases and the encapsulant base and exposes the first and second traces and is located outside the peripheries of the first and second chips;

forming an electrical interconnect in the through-hole that contacts the first and second traces in the through-hole;

forming first and second connection joints, wherein the first connection joint contacts and electrically connects the first trace and the first pad, and the second connection joint contacts and electrically connects the second trace and the second pad; and removing the attachment joint.

22. The method of claim 21, wherein forming the attachment joint includes welding the first and second carriers to one another.

23. The method of claim 21, wherein forming the encapsulant base includes transfer molding the encapsulant base.

24. The method of claim 21, wherein forming the through-hole includes mechanically drilling the through-hole through the first and second metal bases, the first and second traces and the encapsulant base.

25. The method of claim 21, wherein forming the electrical interconnect includes electrolessly plating a metal on sidewalls of the first and second metal bases, the first and second traces and the encapsulant base.

26. The method of claim 21, including electroplating the first trace on the first metal base, and electroplating the second trace on the second metal base.

27. The method of claim 21, including bending the first metal base to form a pair of legs that extend across a thickness of the first chip, then positioning the carriers such that the legs across a thickness of the second chip and contact the second metal base, and then forming the attachment joint between the legs and the second metal base.

28. The method of claim 21, including etching the first metal base to expose the first trace and etching the second metal base to expose the second trace after forming the electrical interconnect.

29. The method of claim 21, wherein the module is a dual in-line memory module.

30. The method of claim 21, wherein the module is devoid of wire bonds, TAB leads and solder joints.

31. A method of making a semiconductor module, comprising;

providing a first semiconductor chip that includes a first conductive pad;

providing a first metal base;

electroplating a first conductive trace on the first metal base;

disposing a first insulative adhesive between the first chip and the first metal base, thereby mechanically attaching the first chip to the first metal base;

providing a second semiconductor chip that includes a second conductive pad;

providing a second metal base;

electroplating a second conductive trace on the second metal base;

disposing a second insulative adhesive between the second chip and the second metal base, thereby mechanically attaching the second chip to the second metal base; and then, in the sequence set forth, forming an attachment joint that mechanically attaches the first and second metal bases;

forming an encapsulant base that contacts the first and second metal bases and the first and second traces;

forming a through-hole that extends through the first and second metal bases and the encapsulant base and exposes the first and second traces and is located outside the peripheries of the first and second chips; and forming an electrical interconnect in the through-hole that contacts the first and second traces in the through-hole, wherein a first connection joint contacts and electrically connects the first trace and the first pad, and a second connection joint contacts and electrically connects the second trace and the second pad, such that the first and second pads are electrically connected to one another by an electrically conductive path that includes the first and second traces, the first and second connection joints and the electrical interconnect.

32. The method of claim 31, wherein forming the attachment joint includes welding the first and second metal bases to one another.

33. The method of claim 31, wherein forming the encapsulant base includes contacting the encapsulant base to the first and second chips on surfaces opposite the first and second pads.

34. The method of claim 31, wherein forming the encapsulant base includes transfer molding the encapsulant base.

35. The method of claim 31, wherein forming the through-hole includes mechanically drilling the through-hole through the first and second metal bases, the first and second traces and the encapsulant base.

36. The method of claim 31, wherein forming the electrical interconnect includes electrolessly plating a first metal on sidewalls of the through-hole and surfaces of the first and second metal bases adjacent to and outside the through-hole and then electroplating a second metal on the first metal.

37. The method of claim 31, including forming the connection joints after forming the electrical interconnect.

38. The method of claim 31, including removing the attachment joint after forming the encapsulant base.

39. The method of claim 31, including forming an insulative material in the through-hole after forming the electrical interconnect in the through-hole, wherein the electrical interconnect contacts all sidewall portions of the through-hole without plugging the through-hole, and the insulative material contacts the electrical interconnect and fills all remaining space in the through-hole.

40. The method of claim 31, wherein the module is devoid of wire bonds, TAB leads and solder joints.

41. A method of making a semiconductor module, comprising:

providing a first semiconductor chip assembly that includes a first semiconductor chip and a first carrier, wherein the first chip includes a first conductive pad, and the first carrier includes a first metal base and a first conductive trace;

providing a second semiconductor chip assembly that includes a second semiconductor chip and a second carrier, wherein the second chip includes a second conductive pad, and the second carrier includes a second metal base and a second conductive trace;

mechanically attaching the first and second assemblies, thereby defining a chamber between the first and second assemblies;

filling an encapsulant base into the chamber;

forming a through-hole that extends through the first and second metal bases and the encapsulant base and exposes the first and second traces and is located outside the peripheries of the first and second chips;

forming an electrical interconnect in the through-hole that contacts the first and second traces; and forming first and second connection joints, wherein the first connection joint contacts and electrically connects the first trace and the first pad, and the second connection joint contacts and electrically connects the second trace and the second pad.

42. The method of claim 41, wherein mechanically attaching the assemblies includes bending the first metal base near opposing lateral ends of the first metal base to form a pair of legs in the first metal base, and forming a pair of attachment joints that mechanically attach the legs to the second metal base.

43. The method of claim 42, wherein forming the attachment joints includes welding the legs to the second metal base.

44. The method of claim 42, including removing the legs and the attachment joints after filling the encapsulant base.

45. The method of claim 41, wherein filling the encapsulant base includes contacting the encapsulant base to the first and second chips, the first and second metal bases and the first and second traces in the chamber.

46. The method of claim 41, wherein filling the encapsulant base includes transfer molding the encapsulant base.

47. The method of claim 41, wherein forming the through-hole includes mechanically drilling the through-hole through the first and second metal bases, the first and second traces and the encapsulant base.

48. The method of claim 41, wherein forming the electrical interconnect includes electrolessly plating a metal on sidewalls of the through-hole.

49. The method of claim 41, including forming the connection joints after forming the electrical interconnect.

50. The method of claim 41, wherein the module is devoid of wire bonds, TAB leads and solder joints.

51. A semiconductor module, comprising:

a first semiconductor chip assembly that includes a first semiconductor chip, a first conductive trace and a first connection joint, wherein the first chip includes a first conductive pad, the first trace extends within and outside a periphery of the first chip, and the first connection joint contacts and electrically connects the first trace and the first pad;

a second semiconductor chip assembly that includes a second semiconductor chip, a second conductive trace and a second connection joint, wherein the second chip includes a second conductive pad, the second trace extends within and outside a periphery of the second chip, and the second connection joint contacts and electrically connects the second trace and the second pad;

an encapsulant base disposed between and in contact with the first and second chips and the first and second traces; and an electrical interconnect disposed in a through-hole that extends through the encapsulant base and is located outside the peripheries of the first and second chips, wherein the electrical interconnect contacts the first and second traces in the through-hole, thereby electrically connecting the first and second traces.

52. The module of claim 51, wherein the first and second chips are vertically aligned with one another.

53. The module of claim 51, wherein the first pad faces away from the second chip, and the second pad faces away from the first chip.

54. The module of claim 51, wherein the first trace is a planar metal lead that overlaps the first pad, and the second trace is planar metal lead that overlaps the second pad.

55. The module of claim 51, wherein the encapsulant base is a molded insulator.

56. The module of claim 51, wherein the encapsulant base is plastic.

57. The module of claim 51, wherein the electrical interconnect contacts the first and second traces at first and second sidewall portions of the through-hole that are vertically spaced from one another and span 360 degrees around the through-hole.

58. The module of claim 51, wherein the electrical interconnect includes a metal that is electrolessly plated on sidewalls of the through-hole.

59. The module of claim 51, wherein the module is a dual in-line memory module.

60. The module of claim 51, wherein the module is devoid of wire bonds, TAB leads and solder joints.

61. A semiconductor module, comprising:
 a first semiconductor chip assembly that includes a first semiconductor chip, a first conductive trace and a first connection joint, wherein the first chip includes a first top surface, a first bottom surface and first outer edges between the first top and bottom surfaces, the first top surface includes a first conductive pad, the first trace extends within and outside a periphery of the first chip, and the first connection joint contacts and electrically connects the first trace and the first pad;
 a second semiconductor chip assembly that includes a second semiconductor chip, a second conductive trace and a second connection joint, wherein the second chip includes a second top surface, a second bottom surface and second outer edges between the second top and bottom surfaces, the second top surface includes a second conductive pad, the second trace extends within and outside a periphery of the second chip, and the second connection joint contacts and electrically connects the second trace and the second pad;
 a transfer molded encapsulant base disposed between and in contact with the first and second chips and the first and second traces, wherein the encapsulant base contacts the first and second bottom surfaces and the first and second outer edges; and
 an electrical interconnect disposed in a through-hole, wherein the through-hole extends through the first and second traces and the encapsulant base and is located outside the peripheries of the first and second chips, and the electrical interconnect covers vertical sidewalls of the through-hole and contacts the first and second traces at the sidewalls such that an electrically conductive path between the first and second pads consists of the first and second connection joints, the first and second traces and the plated metal interconnect.

62. The module of claim 61, wherein the first and second chips are vertically aligned with one another.

63. The module of claim 61, wherein the first pad faces away from the second chip, and the second pad faces away from the first chip.

64. The module of claim 61, wherein the first trace is a planar plated metal lead that overlaps the first pad, and the second trace is planar plated metal lead that overlaps the second pad.

65. The module of claim 61, wherein the encapsulant base is essentially coplanar with the first and second traces.

66. The module of claim 61, wherein the encapsulant base does not contact the first top surface and does not contact the second top surface.

67. The module of claim 61, wherein the encapsulant base is plastic.

68. The module of claim 61, wherein the electrical interconnect contacts the first trace at a first portion of the sidewalls that spans 360 degrees around the through-hole, contacts the second trace at a second portion of the sidewalls that spans 360 degrees around the through-hole, and contacts the encapsulant base at a third portion of the sidewalls that spans 360 degrees around the through-hole and is sandwiched between the first and second portions.

69. The module of claim 61, wherein the module is a dual in-line memory module.

70. The module of claim 61, wherein the module is devoid of wire bonds, TAB leads and solder joints.

* * * * *

UNITED STATES PATENT AND TRADEMARK OFFICE
CERTIFICATE OF CORRECTION

PATENT NO. : 6,486,549 B1  Page 1 of 1
DATED : November 26, 2002
INVENTOR(S) : Cheng-Lien Chiang It is certified that error appears in the above-identified patent and that said Letters Patent is hereby corrected as shown below:

<u>Column 25,</u>
Line 13, delete ".".

<u>Column 27,</u>
Line 37, change "," to -- --.

Signed and Sealed this

Twenty-fifth Day of February, 2003

JAMES E. ROGAN
*Director of the United States Patent and Trademark Office*